(12) United States Patent
Nakano

(10) Patent No.: US 9,107,285 B2
(45) Date of Patent: Aug. 11, 2015

(54) ELECTRONIC EQUIPMENT AND STRUCTURE INCLUDING BATTERY UNIT

(71) Applicant: Kabushiki Kaisha Toshiba, Tokyo (JP)

(72) Inventor: Masanori Nakano, Koganei (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 434 days.

(21) Appl. No.: 13/687,908

(22) Filed: Nov. 28, 2012

(65) Prior Publication Data

US 2013/0194731 A1    Aug. 1, 2013

(30) Foreign Application Priority Data

Jan. 31, 2012   (JP) .................................. 2012-019341

(51) Int. Cl.
*G06F 1/16*   (2006.01)
*H05K 7/00*   (2006.01)

(52) U.S. Cl.
CPC ............... *H05K 7/00* (2013.01); *G06F 1/1601* (2013.01); *G06F 1/169* (2013.01); *G06F 1/1616* (2013.01)

(58) Field of Classification Search
CPC combination set(s) only.
See application file for complete search history.

(56) References Cited

U.S. PATENT DOCUMENTS

| 5,272,598 | A | * | 12/1993 | Kobayashi et al. | ...... 361/679.32 |
|---|---|---|---|---|---|
| 5,459,388 | A | * | 10/1995 | Illingworth et al. | ............... 429/7 |
| 5,475,626 | A | * | 12/1995 | Viletto | ...... 361/679.55 |
| 5,583,744 | A | * | 12/1996 | Oguchi et al. | ........... 361/679.58 |
| 6,159,632 | A | * | 12/2000 | Osawa | .......................... 429/100 |
| 6,224,996 | B1 | * | 5/2001 | Bovio et al. | ...................... 429/99 |
| 6,560,100 | B1 | * | 5/2003 | Shin et al. | ................ 361/679.41 |
| 6,617,063 | B1 | * | 9/2003 | Ohnishi | ............................ 429/7 |
| 6,933,921 | B2 | | 8/2005 | Yasuda et al. | |
| 7,633,492 | B2 | | 12/2009 | Hsu | |
| 7,898,528 | B2 | | 3/2011 | Hsu | |
| 8,216,709 | B2 | | 7/2012 | Takeguchi et al. | |
| 2004/0027333 | A1 | | 2/2004 | Yasuda et al. | |
| 2004/0136154 | A1 | | 7/2004 | Hsu | |
| 2005/0069739 | A1 | * | 3/2005 | Ozeki et al. | ..................... 429/22 |
| 2006/0210869 | A1 | * | 9/2006 | Takeguchi et al. | ............ 429/153 |
| 2006/0234118 | A1 | * | 10/2006 | Nakajima et al. | ............. 429/153 |
| 2007/0002030 | A1 | | 1/2007 | Hsu | |
| 2009/0244820 | A1 | | 10/2009 | Kusaka et al. | |
| 2010/0165555 | A1 | * | 7/2010 | Tobiyama et al. | ....... 361/679.01 |
| 2011/0134065 | A1 | | 6/2011 | Hsu | |

(Continued)

FOREIGN PATENT DOCUMENTS

| JP | 2003-308166 A | 10/2003 |
|---|---|---|
| JP | 2004-220558 A | 8/2004 |

(Continued)

*Primary Examiner* — Lisa Lea Edmonds
(74) *Attorney, Agent, or Firm* — Knobbe, Martens, Olson & Bear LLP

(57) ABSTRACT

A battery structure includes an input device, a housing, an electronic component, a first battery cell, a second battery cell, a case and a protection circuit. The input device includes a flat input surface. The housing is configured to support the input device and to accommodate components therein. The electronic component and the first and second battery cells are in the housing. The second battery cell overlaps at least partially with the electronic component in a thickness direction of the housing, and is thinner than the first battery cell. The case includes a frame configured to enclose the first and second battery cells and a joist inside the frame in a lattice pattern between the first and second battery cells. The protection circuit is configured to be electrically connected to the first and second battery cells at a position apart from the second battery cell.

10 Claims, 23 Drawing Sheets

(56) References Cited

U.S. PATENT DOCUMENTS

| | | | |
|---|---|---|---|
| 2011/0149489 A1* | 6/2011 | Kusaka | 361/679.01 |
| 2011/0176283 A1 | 7/2011 | Takei | |
| 2012/0276432 A1 | 11/2012 | Takeguchi et al. | |
| 2014/0063351 A1* | 3/2014 | Sato | 348/725 |
| 2014/0063710 A1* | 3/2014 | Myung | 361/679.4 |

FOREIGN PATENT DOCUMENTS

| | | |
|---|---|---|
| JP | 2006-092578 A | 4/2006 |
| JP | 2006-260973 A | 9/2006 |
| JP | 2009-238175 A | 10/2009 |
| JP | 2011-044359 A | 3/2011 |
| JP | 2011-187457 A | 9/2011 |

\* cited by examiner

ELECTRONIC EQUIPMENT AND STRUCTURE INCLUDING BATTERY UNIT

CROSS REFERENCE TO RELATED APPLICATION(S)

The present disclosure relates to the subject matters contained in Japanese Patent Application No. 2012-019341 filed on Jan. 31, 2012, which are incorporated herein by reference in its entirety.

FIELD

One or more embodiments of the present invention relate to an electronic equipment and a structure including a battery unit.

BACKGROUND

A structure including a battery unit in which a battery installed and an electronic equipment have been provided.

An electronic equipment is required to be further thinner.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION

According to one embodiment, a battery structure includes an input device, a housing, an electronic component, a first battery cell, a second battery cell, a case and a protection circuit. The input device includes a flat input surface. The housing is configured to support the input device and to accommodate components therein. The electronic component and the first and second battery cells are in the housing. The second battery cell overlaps at least partially with the electronic component in a thickness direction of the housing, and is thinner than the first battery cell. The case includes a frame configured to enclose the first and second battery cells and a joist inside the frame in a lattice pattern between the first and second battery cells. The protection circuit is configured to be electrically connected to the first and second battery cells at a position apart from the second battery cell.

Hereinafter, exemplary embodiments of the present invention will be described with reference to the accompanying drawings.

First Exemplary Embodiment

Figure 1:
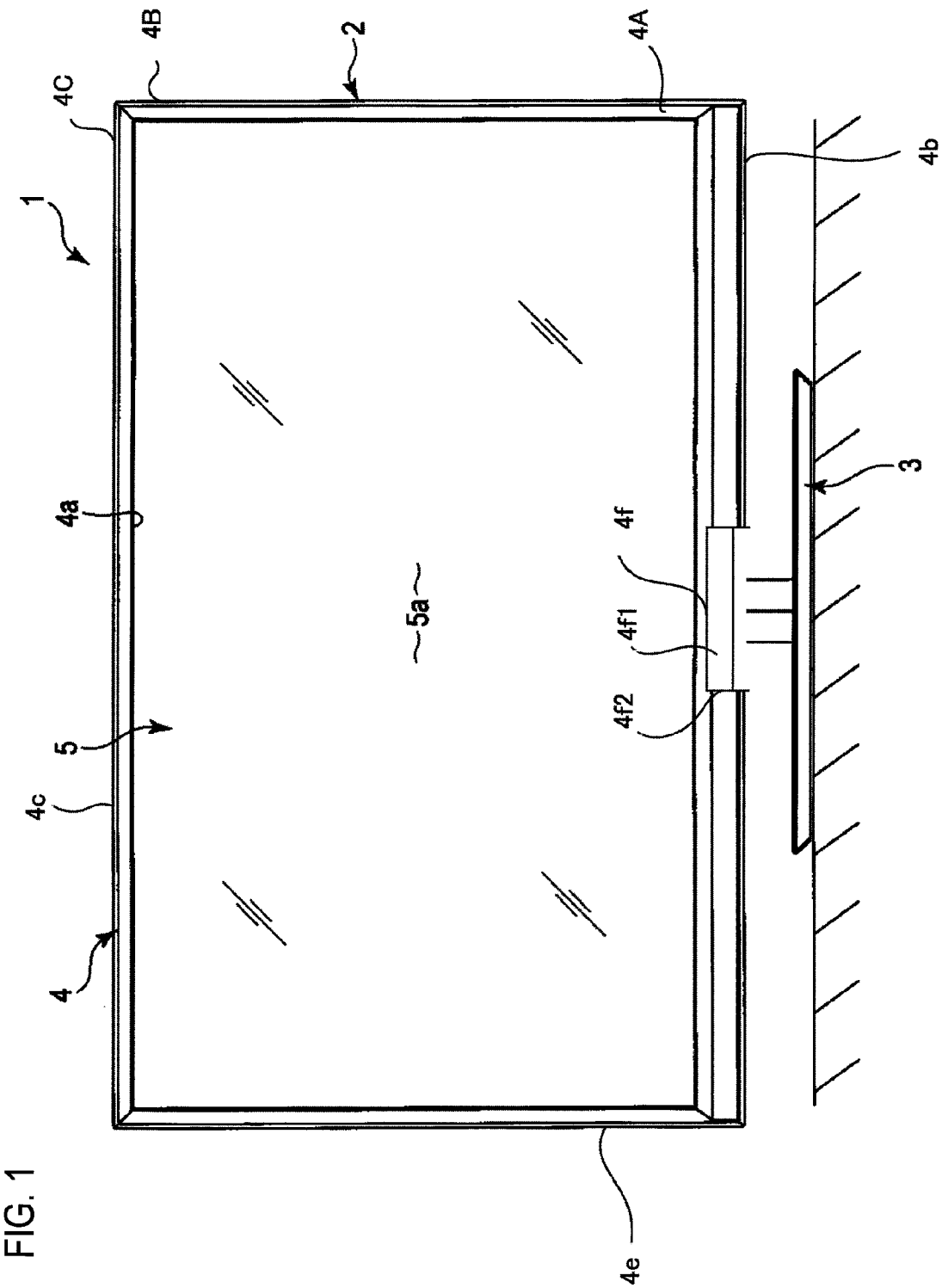
FIG. 1 is a front view of a television receiver according to a first exemplary embodiment of the present invention.
Figure 2:
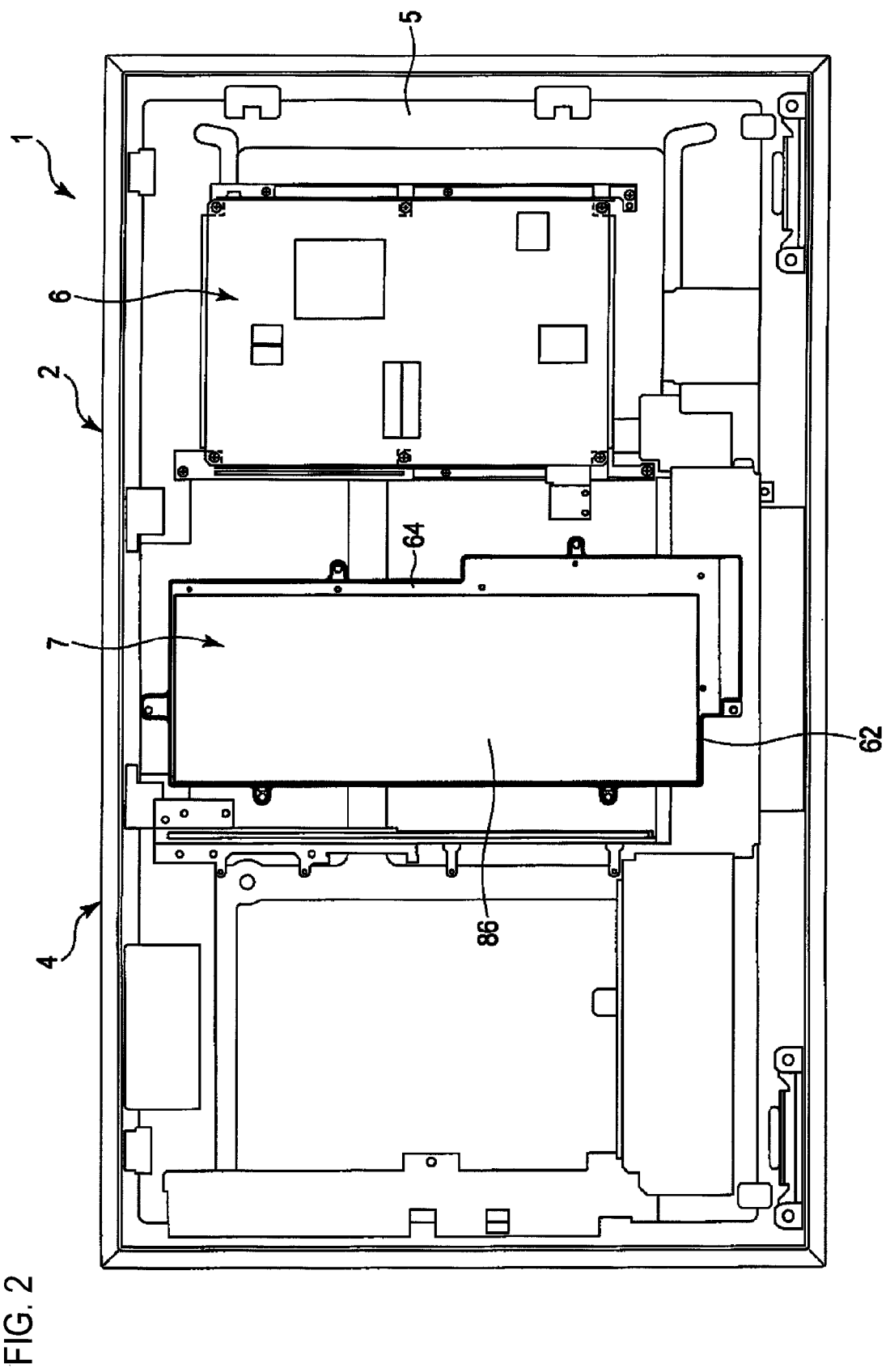
FIG. 2 is a rear view illustrating the inside of the television receiver shown in FIG. 1.
Figure 3:
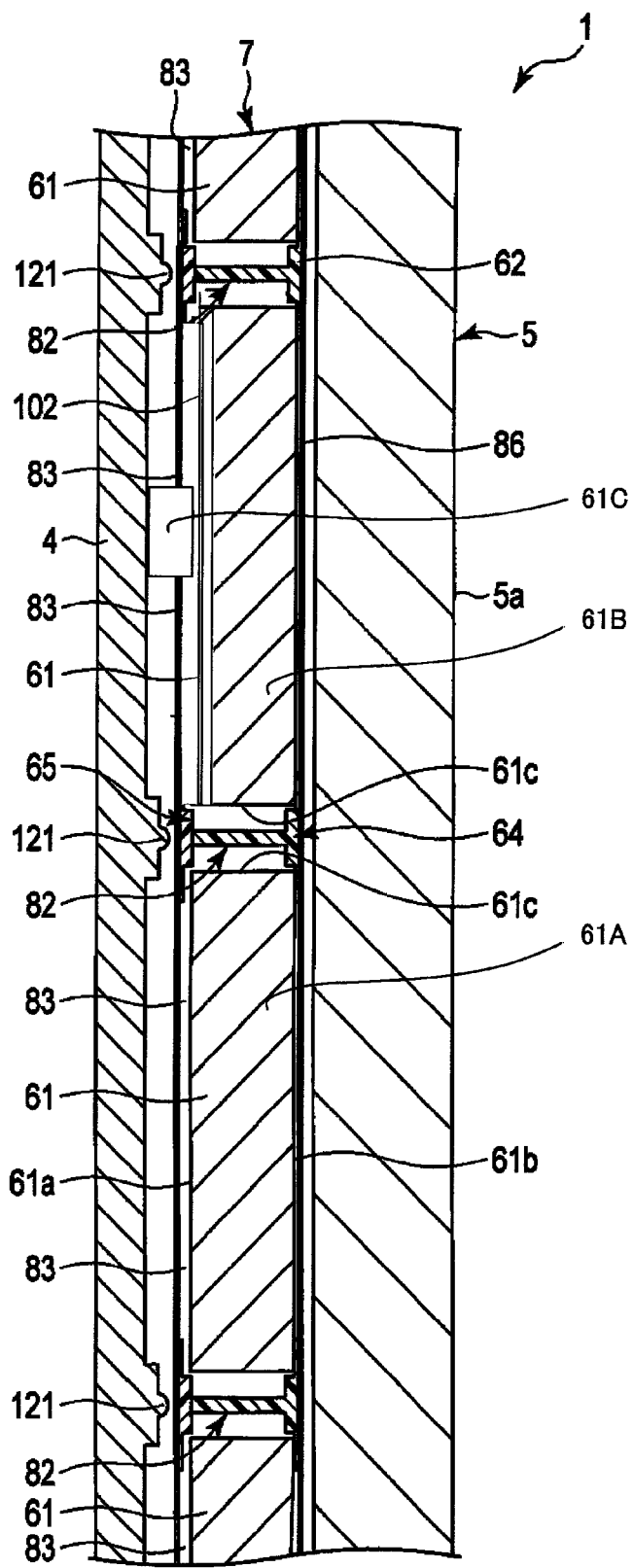
FIG. 3 is a cross-sectional view of the television receiver shown in FIG. 1.

FIGS. 1 to 3 show a television receiver 1 according to a first exemplary embodiment of the present invention. The television receiver 1 is an example of an "electronic equipment". As shown in FIG. 1, the television receiver 1 includes a display unit 2 and a stand (a supporting member, a support, or a pedestal) 3 that supports the display unit 2.

The display unit 2 includes a housing 4, which is a box shaped structure configured by assembling a front mask and a back cover as a member that covers and protects components received therein, and a display device (display panel or panel) 5 received in the housing 4. The display device 5 includes a display screen (a contact sensing module, an electrostatic sensing module, a touch sensor, a detecting module, a pointing device area, a manipulating module that receives an input for the screen, an input surface, and an input receiving surface) 5a including a touch panel (input device).

The housing 4 is provided with an opening 4a through which the display screen 5a is exposed. If the opening 4a exposes the display screen, the structure of the opening 4a is not limited to an opened structure, but may be replaced with a region in a transparent panel such as glass or plastic through which light is transmitted.

The housing 4 has a front surface (a part of a front cover, periphery of the display screen, a surface facing a user, a side of the input surface, a surface at the input surface side, or a surface) 4A, a back surface (a surface opposing the front surface, a rear surface, a part of a back cover, or a surface) 4B, and a side surface 4C extending between the front surface and the back surface.

The housing 4 includes, in a region including a part or all of each of the front surface 4A, the back surface 4B, and the side surface 4C, a lower edge (one end, a border, a side, a surface, or a part) 4b located at the stand 3 side of the housing 4, a upper edge (one end, a border, a side, a surface, or a part) 4c located to be opposite to the lower edge, and side edges 4d and 4e (a left edge, a right edge, one end, a border, a side, a surface, or a part) extending between the upper edge and the lower edge.

As shown in FIG. 1, the housing 4 is provided with another opening 4f neighboring (near, adjacent, parallel) the opening 4a. The opening 4f includes a bottom surface 4f1 and a peripheral wall (a wall portion, an erected portion, a side, a frame, a concave portion, a fence, a fenced portion, a protrusion, a stopper, a hooking portion, or a step) 4f2 extending in a direction (a direction intersecting with the bottom surface 4f1, a direction seen from a user side/input side, or a thickness direction of the housing) erected from the bottom surface 4f1 at the periphery (a side, an edge, a border, a circumference, or around) of the bottom surface 4f1.

The opening 4f is located at the lower edge 4b side of the housing 4. The opening 4f spans (reaches, extends, lined, connected, or continues) the side surface 4C at the lower edge 4b side from the front surface 4A of the housing 4. A thickness of the housing 4 at a corresponding region on the bottom surface 4f1 of the opening 4f (distance between the front surface 4A and the back surface 4B) is smaller than that of the housing 4 at the surrounding region.

The distance from a portion of the back surface 4B disposed at the outer portion of the housing 4 to the bottom surface 4f1 is shorter than that to the display screen 5a. That is, when seen from the thickness direction of the housing, the bottom surface 4f1 is positioned lower than the display screen 5a (a position closer to the back surface).

The bottom surface 4f1 is provided with a manipulating module (input module, input receiving module, a part of the input module, a region included in an input surface, a portion included in the manipulating surface, an electronic component, or a component) such as a button, a sensor, or a remote controller receiving module that receives an input from outside, which is not shown). The manipulating module is provided on an extension to which the stand 3 extends with respect to an external mounting surface so as to stably support a portion to which a pressure is applied from the outside, such as the button.

The position of the manipulating module is emphasized with respect to a design aspect. The steps such as the peripheral wall 4f2 help the user to haptically manipulate. Since the manipulating module is one step lower than the screen, a part of the manipulating module becomes a blind corner from a view point of the user who watches the display screen. Therefore, it is possible to restrict the design of the manipulating module from being noticeable. For example, as the step becomes higher (as the manipulating module is remotely located at the stand 3 side), the manipulating module disappears out of the sight of the user and is remote from the user. However, the user does not lose visual contact with the manipulating module by the concave portion of peripheral wall.

As shown in FIG. 2, in the housing 4, a circuit board 6 and a battery unit (a power module, a power supply module, or a battery module) 7 are accommodated. Details and the description of the housing 4, the circuit board 6, the opening 4f, circumference configuration and structure of the opening 4f, and the battery unit 7 are the same as those in the electronic equipment 11 according to second or later exemplary embodiment. Therefore, the second exemplary embodiment will be described in detail as a representative, and the detailed description of those will be omitted in the present exemplary embodiment. In FIGS. 1 to 3, configurations having equal or similar functions to the second exemplary embodiment are denoted by the same reference numerals.

Second Exemplary Embodiment

Next, referring to FIGS. 4 to 22, the electronic equipment 11 according to the second exemplary embodiment will be described. The electronic equipment 11 is, for example, a notebook type portable computer (notebook PC). However, the electronic equipment to which the present exemplary embodiment may be applied is not limited thereto. The present exemplary embodiment may be applied to other electronic equipment such as, for example, a slate type portable computer (slate PC), a portable phone including a smart phone, or a game machine.

Figure 4:
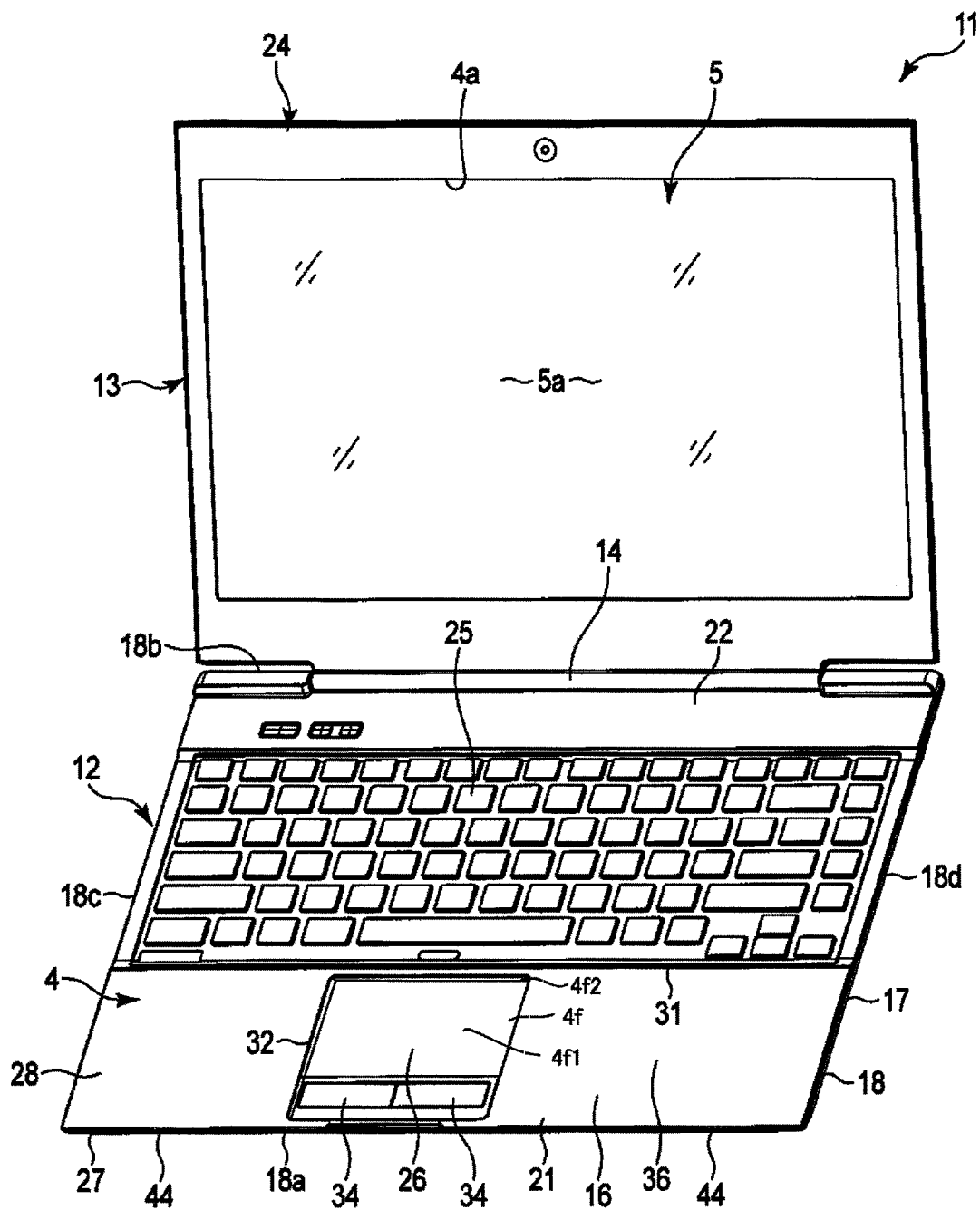
FIG. 4 is a perspective view of an electronic equipment according to a second exemplary embodiment of the present invention.

As shown in FIG. 4, the electronic equipment 11 includes a first unit 12, a second unit 13, and a hinge module 14. The first unit 12 is a main body unit in which a main board (a first substrate, a board, a substrate, an electronic component, or a component) is installed. The first unit 12 includes a first housing 4. An example of the first housing 4 is a metal material such as a magnesium alloy or a resin material, and the first housing 4 has a relatively high rigidity (higher than that of plastic, even though the housing is dropped from a desk, there is less chance of deformation or damage). The first housing 4 includes an upper wall (wall or an area including an upper surface) 16, a lower wall (wall or an area including a lower surface) 17, and a peripheral wall (wall, a side wall, or an area including a side surface) 18 and is formed of a flat box shape.

When the electronic equipment 11 is located on the desk, the lower wall 17 faces the desk surface (mounting surface). That is, the lower wall 17 configures a cover portion (a supporting portion, a bottom portion, or a bottom surface) that prevents the components accommodated in the housing 4 from being dropped. The lower wall 17 is provided with a plurality of leg portions (supporting portions, branches, stands, elastic members, or rubber legs) 19 (see FIGS. 7 and 11), which are in contact with the desk surface. The upper wall 16 is disposed so as to be opposite to the lower wall 17. A space is provided between the upper wall 16 and the lower wall 17 so that the upper wall 16 extends so as to be substantially parallel to the lower wall 17. The upper wall 16 is a cover portion (a cover, a top surface, a front surface, a protection surface, or a surface including an input receiving portion and the periphery thereof) that covers the components accommodated in the housing 4 from the view point (a side of an inputting surface) of the user.

A peripheral wall 18 connects between a peripheral edge of the lower wall 17 and a peripheral edge of the upper wall 16. Any one or both of the lower wall 17 and the upper wall 16 may be curved toward the peripheral wall 18 and connected to the peripheral wall 18 substantially in an arc shape or may have a region upright with respect to the mounting surface.

The first housing 4 includes a first edge (a side, an edge) 21 and a second edge (a side, an edge) 22. The first edge 21 is, for example, a front edge. The second edge 22 is, for example, a rear edge and disposed so as to be opposite to the first edge 21. The peripheral wall 18 includes a front wall 18a, a rear wall 18b, a first side wall 18c (for example, a left side wall), and a second side wall 18d (for example, a right side wall).

The front wall 18a is located at the first edge 21. The front wall 18a extends in a longitudinal direction of the housing 4 (a transverse width direction of the housing 4). The rear wall 18*b* is located at the second edge 22. The rear wall 18*b* extends so as to be substantially parallel to the front wall 18*a*. The first and second side walls 18*c* and 18*d* extend in a direction intersecting the front and rear walls 18*a* and 18*b* (for example, in a substantially orthogonal direction). The first and second side walls 18*c* and 18*d* extend in a short direction of the housing 4 (a depth direction of the housing 4). The first and second side walls 18*c* and 18*d* connect the edge of the front wall 18*a* and the edge of the rear wall 18*b*, respectively.

As shown in FIG. 4, the second unit 13 is, for example, a display unit and includes a second housing 24 and a display device 5 accommodated in the second housing 24. For example, the display device 5 is a liquid crystal display, but the display device is not limited thereto. The display device 5 includes a display screen 5*a* on which an image or a video is displayed. The second housing 24 includes an opening 4*a* that exposes the display screen 5*a*.

The second housing 24 is connected to the second edge 22 of the first housing 4 by a hinge module 14 so as to be rotated (opened or closed). Accordingly, the second unit 13 may be rotated between a first position where the first unit 12 and the second unit 13 overlap and a second position where the first unit 12 and the second unit 13 are open.

Next, the mounting structure of the electronic equipment 11 will be described. For convenience of the description, hereinafter "the first housing 4" is simply referred to as "the housing 4".

Figure 5:
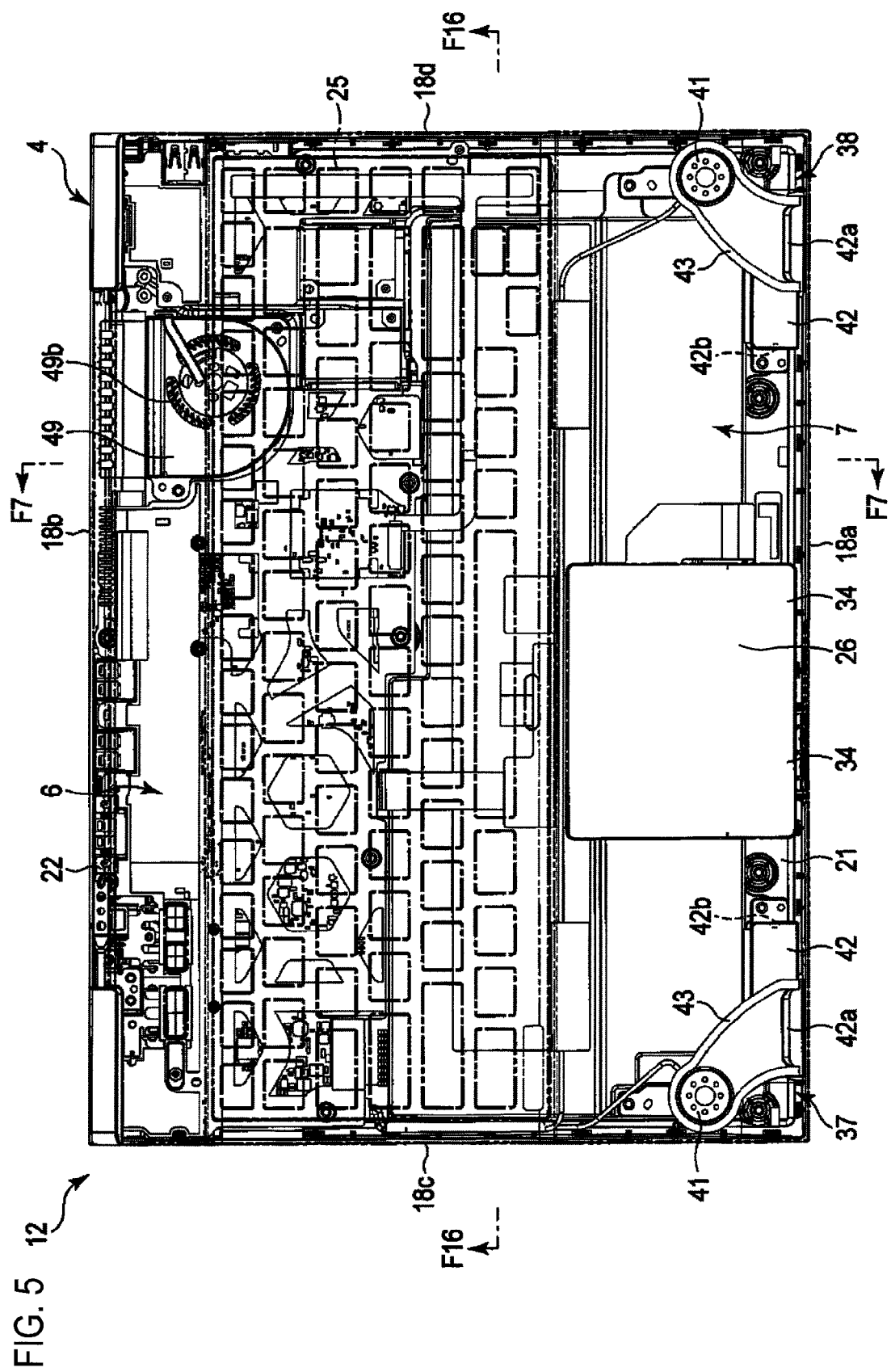
FIG. 5 is a plan view illustrating the inside of a first unit shown in FIG. 4.

As shown in FIGS. 4 and 5, on the upper wall 16 of the housing 4, a keyboard (a first input module, an input receiving module, a part of an input module, an area included in the input surface, a manipulating module, a part included in a manipulating surface, an electronic component, or a component) 25 and a touch pad (a second input module, a second input receiving module, a part of the second input module, an area included in the second input surface, a second manipulating module, a part included in the second manipulating module, an electronic component, a pointing device, or a component) 26 are provided. However, the first and second input modules are not limited thereto, but may be a touch panel (touch sensor), a button, a receiving module, or an input device that can accept the input from the outside or the manipulation of the user.

As shown in FIG. 4, in the housing 4, an opening 4*f* that encloses the touch pad 26 (in which the touch pad 26 is located inside, configured such that the touch pad 26 is disposed on the bottom, a standing wall is provided around the touch pad 26) is provided. The opening 4*f* includes a bottom surface (a surface including the touch pad 26) 4/1 and a peripheral wall (a wall portion, an erected portion, a side, a frame, a concave portion, a fence, a fenced portion, a protrusion, a stopper, or a hooking portion) 4/2 extending in a direction (a direction intersecting with the bottom surface 4/1, a direction seen from a user side/input side, or a thickness direction of the housing) erected from the bottom surface 4/1 at the periphery (a side, an edge, a border, a circumference, or around) of the bottom surface 4/1.

The opening 4*f* is exposed (opened, released) at the upper wall 16 side of the housing 4. The opening 4*f* spans (reaches, extends, lined, connected, or continues) the front wall 18*a* from the upper wall 16 of the housing 4. On the bottom surface 4/1 of the opening 4*f*, the thickness of the housing 4 (the distance and interval between the upper wall 16 and the lower wall 17) in the corresponding area is smaller than that of the housing in the surrounding area.

As shown in FIG. 4, the housing 4 includes a lower cover 27 (base) and an upper cover 28 (cover). The lower cover 27 includes the lower wall 17 and a part of the peripheral wall 18.

The upper cover 28 includes the upper wall 16 and a part of the peripheral wall 18. The lower cover 27 and the upper cover 28 are combined to form the housing 4.

Figure 6:
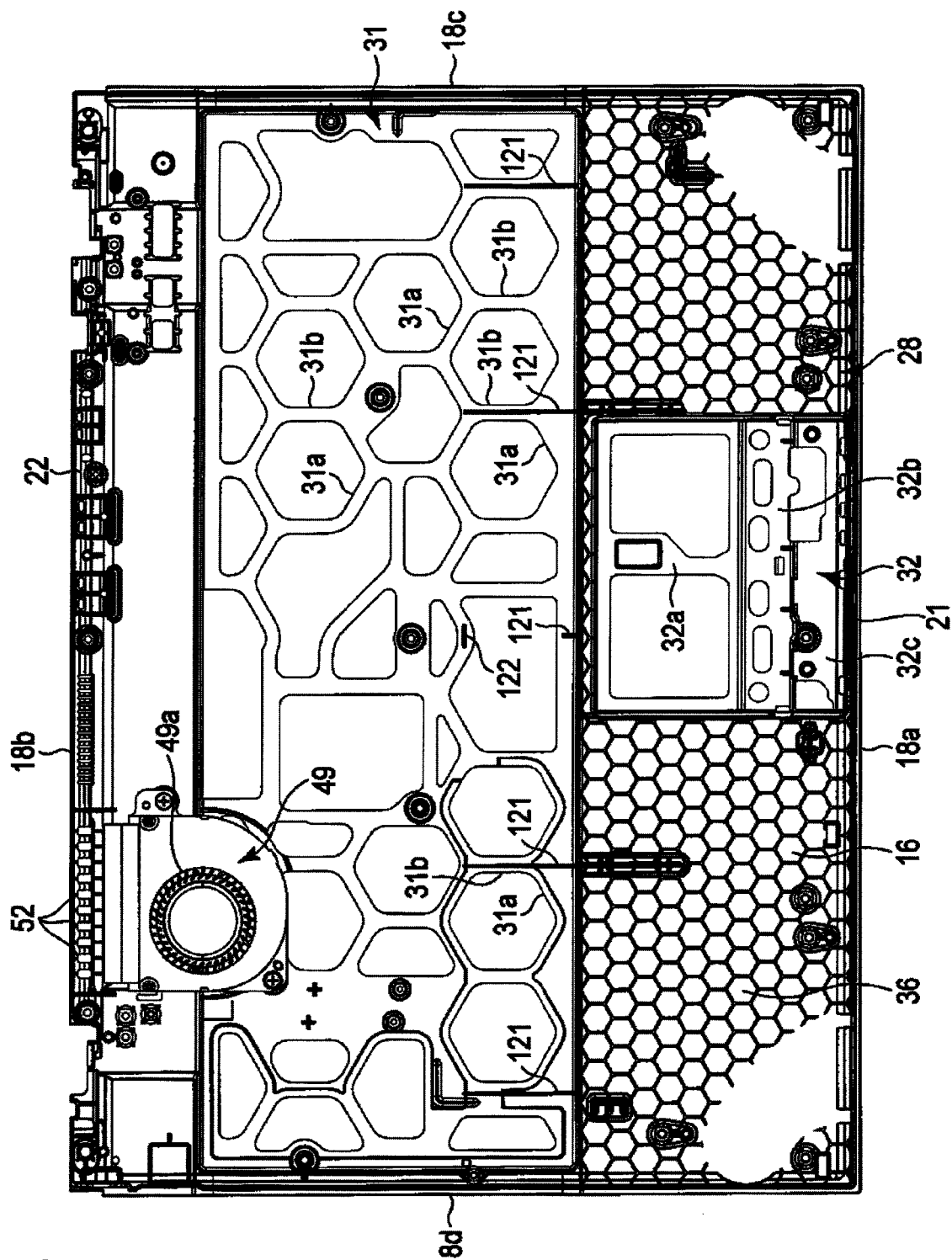
FIG. 6 is a plan view illustrating an inner surface of an upper cover shown in FIG. 4.

FIG. 6 shows the inside of the upper cover 28 by reversing the upper cover 28 to be inside out. The upper cover 28 includes a keyboard attaching module 31 to which the keyboard 25 is attached and a touch pad attaching module 32 to which the touch pad 26 is attached. The keyboard attaching module 31 is an example of the first attaching module and the touch pad attaching module 32 is an example of the second attaching module.

Figure 7:
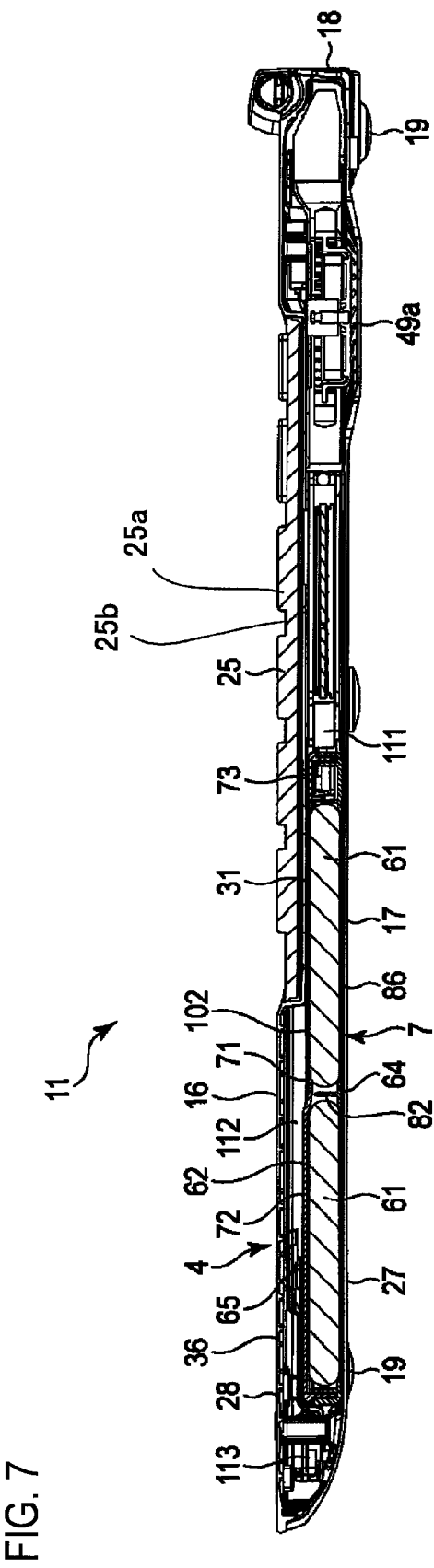
FIG. 7 is a cross-sectional view of the first unit shown in FIG. 5 taken along the line F7-F7.

The keyboard attaching module 31 extends in a longitudinal direction of the housing 4 and spreads almost over the entire width of the housing 4. As shown in FIG. 7, the keyboard attaching module 31 is recessed from the upper wall 16 (a palm rest (a supporting surface, a hold up surface, a plane, or an area near the keyboard and the touch pad) 36). Therefore, the keyboard 25 attached to the keyboard attaching module 31 is almost the same height as the upper wall 16 (palm rest 36) or a little bit higher than the upper wall 16 (palm rest 36)).

Figure 20:
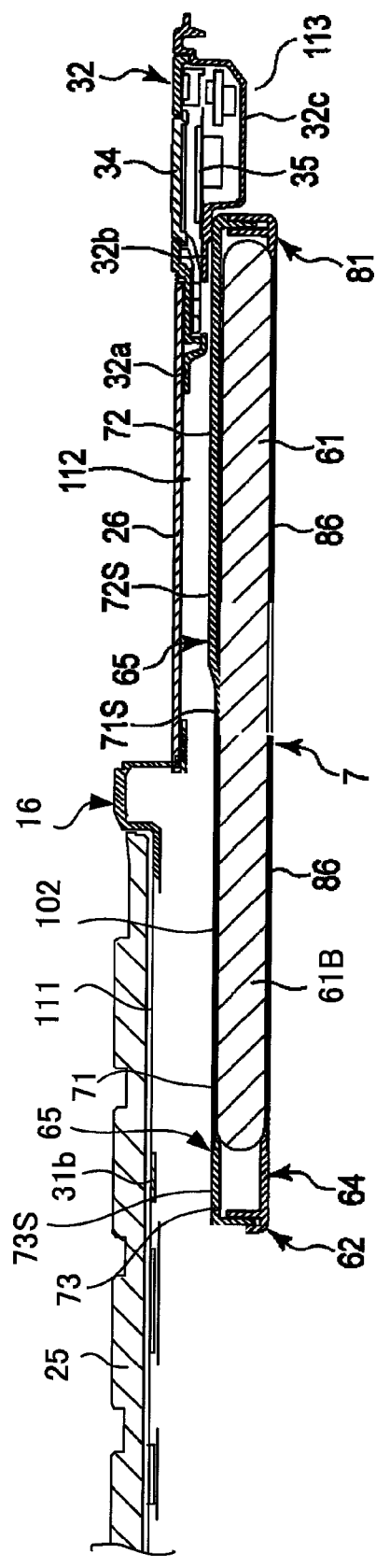
FIG. 20 is a cross-sectional view of a keyboard and the battery unit shown in FIG. 16 taken along the line F20-F20.
Figure 23:
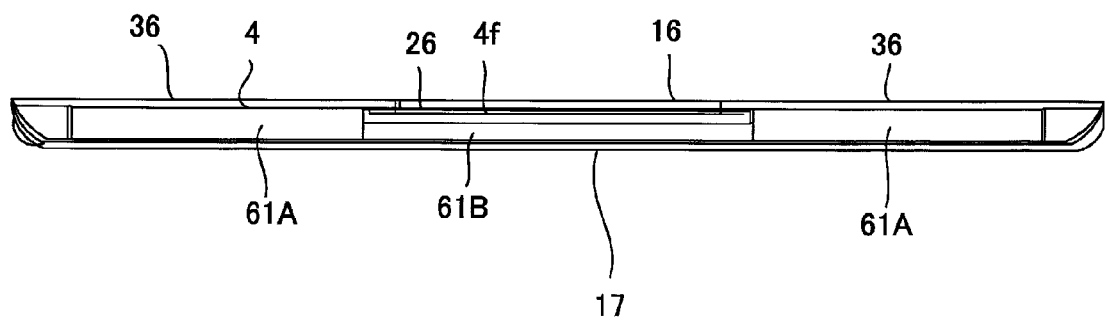
FIG. 23 is a cross-sectional view schematically illustrating the structure of the battery unit according to the second exemplary embodiment.

As shown in FIGS. 20 and 23, the distance of the bottom surface 4/1 from a portion of the lower wall 17 located at the uppermost side of the housing 4 is shorter than top surfaces 25*a* of the keys of the keyboard 25, surfaces 25*b* around the keyboard, or the palm rest 36. In other words, as seen from the thickness direction of the housing, the bottom surface 4/1 is located lower than the top surfaces 25*a* of the keys of the keyboard 25 or the surfaces 25*b* around the keyboard (closer to the lower wall 17).

As shown in FIG. 6, the keyboard attaching module 31 of the exemplary embodiment has a honeycomb structure. That is, the keyboard attaching module 31 has a plurality of hexagonal openings 31*a* and a plurality of joists 31*b* (supports) that extend between the openings 31*a*. The plurality of joists 31*b* are connected to each other to form a hexagonal frame. The joists 31*b* are provided almost over the entire keyboard attaching module 31 and support the keyboard 25 from the lower side.

By the honeycomb structure, the keyboard attaching module 31 ensures both the strength (rigidity) and light-weight. Therefore, even though the user strongly presses the keyboard 25, the keyboard attaching module 31 is hardly bent.

Figure 8:
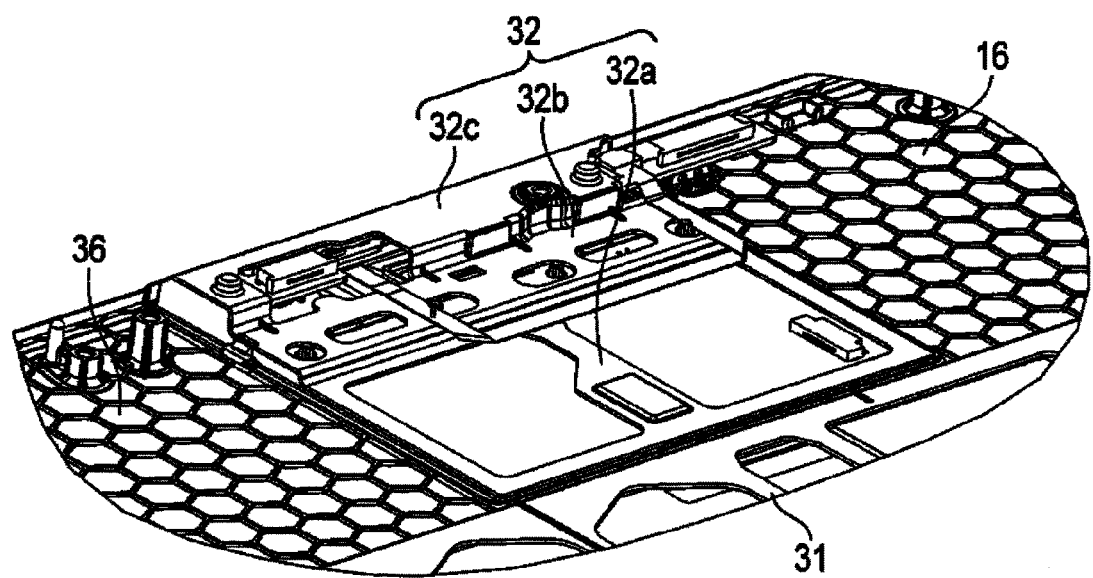
FIG. 8 is a perspective view of a touch pad attaching module shown in FIG. 6.

As shown in FIG. 6, the touch pad attaching module 32 is located between the keyboard attaching module 31 and the first edge 21. As shown in FIGS. 8 and 20, the touch pad attaching module 32 is recessed from the upper wall 16 (palm rest 36). The touch pad attaching module 32 supports the touch pad 26 from the inside (that is, lower side) of the housing 4.

As shown in FIGS. 8 and 20, the touch pad attaching module 32 includes a first portion 32*a*, a second portion 32*b*, and a third portion 32*c*. The first portion 32*a* is adjacent to the keyboard attaching module 31. The first portion 32*a* is thinner than the keyboard attaching module 31 and recessed. On the first portion 32*a*, a flat plate of the touch pad 26 is disposed.

The second portion 32*b* is located between the first portion 32*a* and the first edge 21. The second portion 32*b* is deeper than the first portion 32*a* and shallower than the keyboard attaching module 31 to be recessed. In the second portion 32*b*, a component mounting module of the touch pad 26 is mounted.

The third portion 32*c* is located between the second portion 32*b* and the first edge 21. The third portion 32*c* is deeper than the second portion 32*b*, and recessed to be deeper than the keyboard attaching module 31. In the third portion 32*c*, a button 34 (touch pad button) of the touch pad 26 and a switch 35 (switch substrate) that is manipulated by the button 34 are attached.

As shown in FIG. 4, at both sides of the touch pad attaching module 32, the palm rests 36 are provided. The palm rest 36 extends between the keyboard attaching module 31 and the first edge 21. As shown in FIG. 6, a honeycomb rib (a rib formed of a honeycomb structure) is provided inside the palm rest 36. Accordingly, even though the user strongly presses the palm rest 36, the palm rest is hardly bent.

Figure 9:
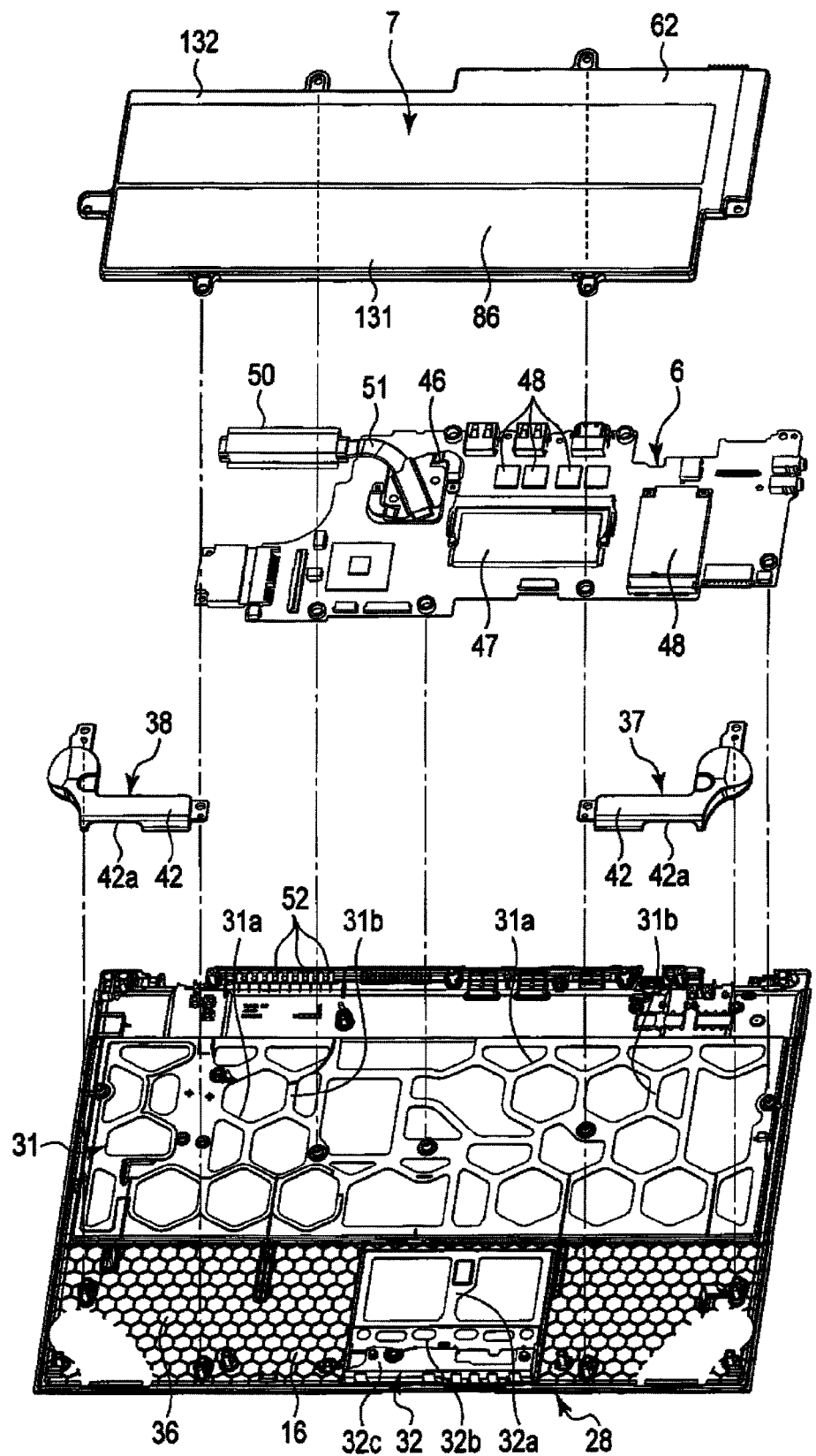
FIG. 9 is an exploded perspective view illustrating the inside of the first unit shown in FIG. 5.
Figure 10:
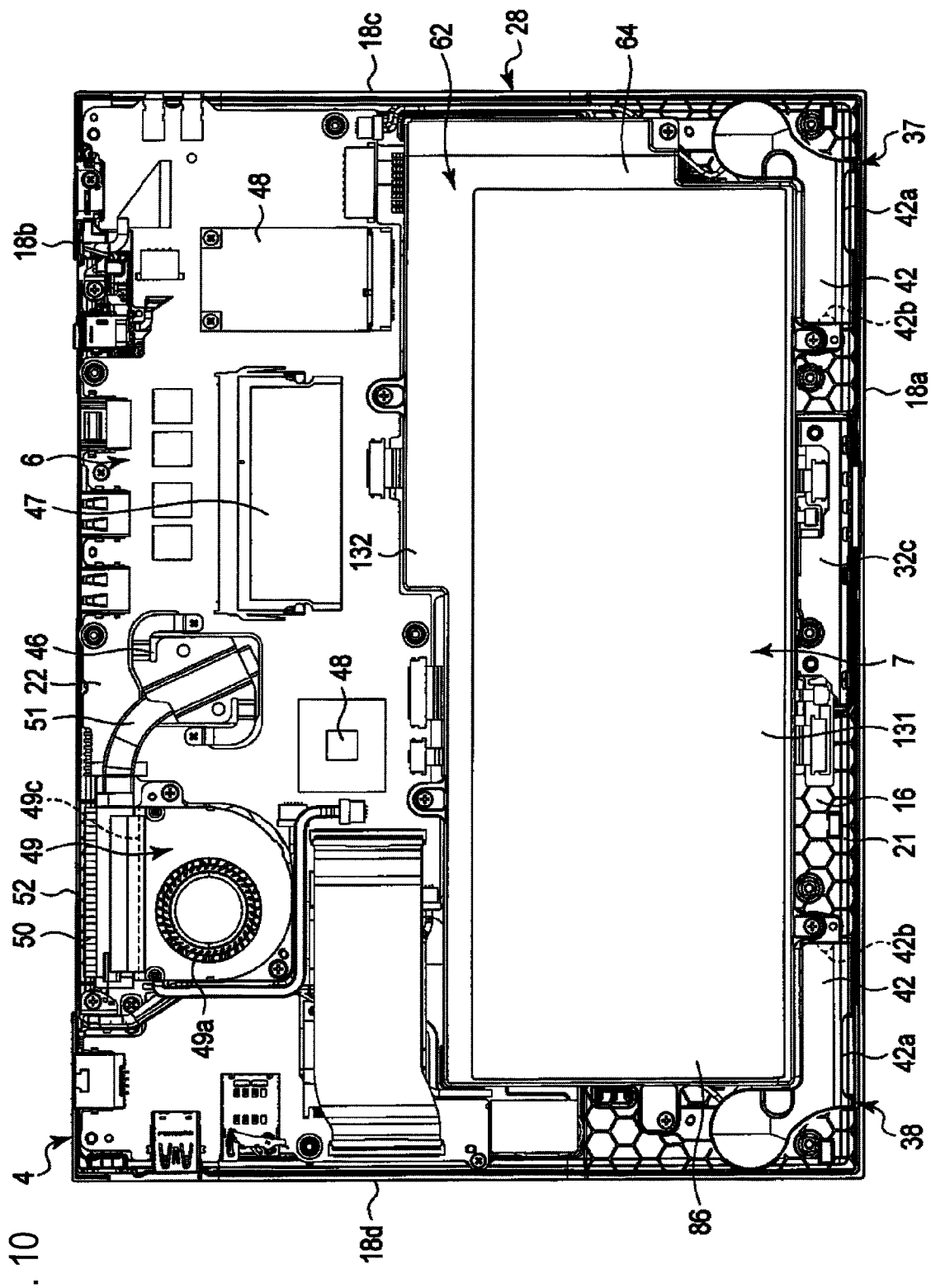
FIG. 10 is a bottom view illustrating the inside of the first unit shown in FIG. 5.

As shown in FIGS. 9 and 10, a pair of speakers 37, 38, a circuit board 6, and a battery unit 7 are accommodated in the housing 4. The speakers 37, 38, the circuit board 6, and the battery unit 7 are attached (fixed) onto the inner surface of the upper wall 16.

As shown in FIGS. 5 and 10, the pair of speakers 37, 38 are separately disposed at right and left edges. The first speaker 37 is disposed along the first side wall 18c and the front wall 18a. The second speaker 38 is disposed along the second side wall 18d and the front wall 18a.

As shown in FIG. 5, the first speaker 37 includes a speaker 41 (a speaker main body) and a speaker box 42 that accommodates the speaker 41. The speaker 41 having a large diameter is adopted to realize high quality sound. The speaker 41 having a large diameter is provided so as to be substantially parallel to the palm rest 36 (the upper wall 16) in order to make the housing 4 thinner. That is, a diaphragm of the speaker 41 faces the inner surface of the palm rest 36 (upper wall 16).

The speaker box 42 includes a first sound emission hole 42a (a first opening) and a second sound emission hole 42b (a second opening). The first sound emission hole 42a emits sound in a mid or high tone range. The first sound emission hole 42a faces the front wall 18a of the housing 4. That is, the first sound emission hole 42a is opened in a direction intersecting the vibration direction (for example, substantially orthogonal direction), rather than the vibration direction of the speaker 41.

A guide 43 that guides the sound from the speaker 41 to the first sound emission hole 42a is provides between the speaker 41 and the first sound emission hole 42a. A sound delivery region (a sound delivery space or a sound delivery module) is formed by the guide 43 between the speaker 41 and the first sound emission hole 42a. The guide 43 is formed of, for example, a cushion (sponge).

As shown in FIG. 4, the front wall 18a of the housing 4 has an opening 44 that faces the first sound emission hole 42a. The sound in the mid or high tone range from the first speaker 37 is emitted from the opening 44 of the front wall 18a to the outside of the housing 4.

As shown in FIG. 10, the second sound emission hole 42b is so-called a hole of a bass reflex and emits a sound in a low tone range (for example, several hundreds Hz). The second sound emission hole 42b is opened toward the inside of the housing 4 in a longitudinal direction of the housing 4. In other words, the sound in a low tone range is emitted into the housing 4. In the present exemplary embodiment, the low tone range is non-directional, and the sound in the low tone range is resonated using the internal space of the housing 4, which increments the sound in the low tone range.

As shown in FIG. 10, the speaker box 42 extends along the front wall 18a. The second sound emission hole 42b is provided at the edge of the speaker box 42 to emit low-pitched sound toward the second side wall 18d. The low-pitched sound emitted from the second sound emission hole 42b passes through a small hole (for example, the touch pad attaching module 32 or a screw hole) of the housing 4 or vibrates the product to be transmitted to the outside.

The second speaker 38 has almost the same configuration as the first speaker 37. Therefore, the configurations having the same functions may be denoted by the same reference numerals and the description thereof will be omitted. The second speaker 38 includes a speaker 41 and a speaker box 42 that accommodates the speaker 41.

As shown in FIG. 10, the speaker box 42 of the second speaker 38 also extends along the front wall 18a. A second sound emission hole 42b of the second speaker 38 is provided at the edge of the speaker box 42 and emits low-pitched sound toward the first side wall 18c. Here, the second sound emission hole 42b of the first speaker 37 faces the second sound emission hole 42b of the second speaker 38. Therefore, the low-pitched sound from the first speaker 37 and the low-pitched sound from the second speaker 38 are combined and incremented within the housing 4 to be transmitted to the outside.

As shown in FIG. 10, the circuit board 6 is provided near the second edge 22 of the housing 4. The circuit board 6 is a rectangle shape. The longitudinal direction of the circuit board 6 is formed along the longitudinal direction of the housing 4. The circuit board 6 is, for example, a main board.

The circuit board 6 is installed with a heat generating component 46, a memory 47, and various electronic components 48. An example of the heat generating component 46 is a central processing unit (CPU), however, the heat generating component 46 is not limited thereto. The heat generating component 46 may be a graphic chip or other components and appropriately correspond to various components that require heat radiation.

In the housing 4, a fan 49, a heat sink 50, and a heat pipe 51 are accommodated. The rear wall 18b of the housing 4 is provided with an air exhaust hole 52 (opening). The heat sink 50 faces the air exhaust hole 52, and the fan 49 faces the heat sink 50.

Figure 11:
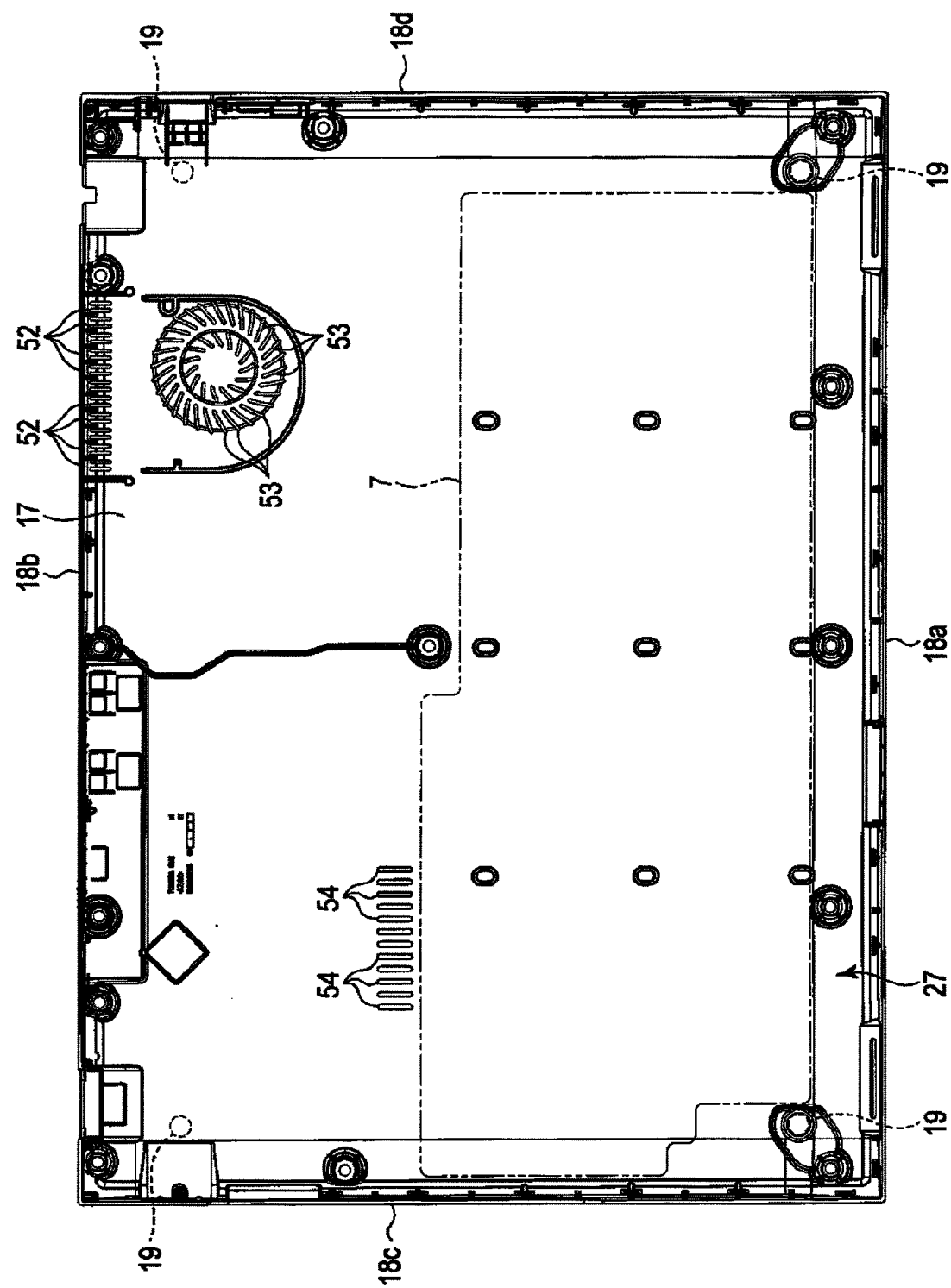
FIG. 11 is a plan view illustrating an inner surface of a lower cover shown in FIG. 5.

As shown in FIG. 11, on the lower wall 17 of the housing 4, a first air suction hole 53 (opening) is provided. The first air suction hole 53 faces the fan 49. As shown in FIGS. 5 and 10, the fan 49 is a centrifugal type and includes two intake ports 49a, 49b separately provided on upper and lower surfaces and a discharging port 49c provided at the side surface.

As shown in FIG. 10, the first intake port 49a faces the first intake port 49a of the lower wall 17 of the housing 4. The fan 49 intakes air from the outside of the housing 4 though the first air suction hole 53. As shown in FIG. 5, the second intake port 49b is disposed so as to be opposite to the first intake port 49a and face the upper wall 16 of the housing 4. The fan 49 sucks the air in the housing 4 through the second intake port 49b. The discharging port 49c faces the heat sink 50. The fan 49 sends wind toward the heat sink 50.

As shown in FIG. 11, the housing 4 includes a second suction hole 54 (opening). The second suction hole 54 is provided so as to be off the battery unit 7 and face the circuit board 6. The fan 49 sucks the air that flows in the housing 4 from the second suction hole 54 through the second intake port 49b.

The heat pipe 51 is an example of a heat conductive member. The heat pipe 51 extends between the heat generating component 46 and the heat sink 50 to thermally connect the heat generating component 46 and the heat sink 50.

As shown in FIG. 10, the battery unit 7 is attached between the circuit board 6 and the first edge 21 of the housing 4. The battery unit 7 is an example of each of "a battery pack", "a battery", "a battery cell", "a unit", and "a module".

The battery unit 7 is a rectangle shape. The longitudinal direction of the battery unit 7 is substantially same as the longitudinal direction of the housing 4. The battery unit 7 extends to be substantially parallel to the circuit board 6, for example, spreads almost over the entire housing 4. As shown in FIG. 10, the battery unit 7 and the circuit board 6 partially overlap in a direction intersecting the thickness direction of the housing 4 (for example, substantially, orthogonal direction). That is, the battery unit 7 and the circuit board 6 partially overlap in a direction that is substantially parallel to the upper wall 16.

As shown in FIG. 10, the battery unit 7 is located between the circuit board 6 and the speakers 37, 38. The front edge of the battery unit 7 is located between the first speaker 37 and the second speaker 38.

Next, the structure of the battery unit 7 will be described in detail.

Figure 12:
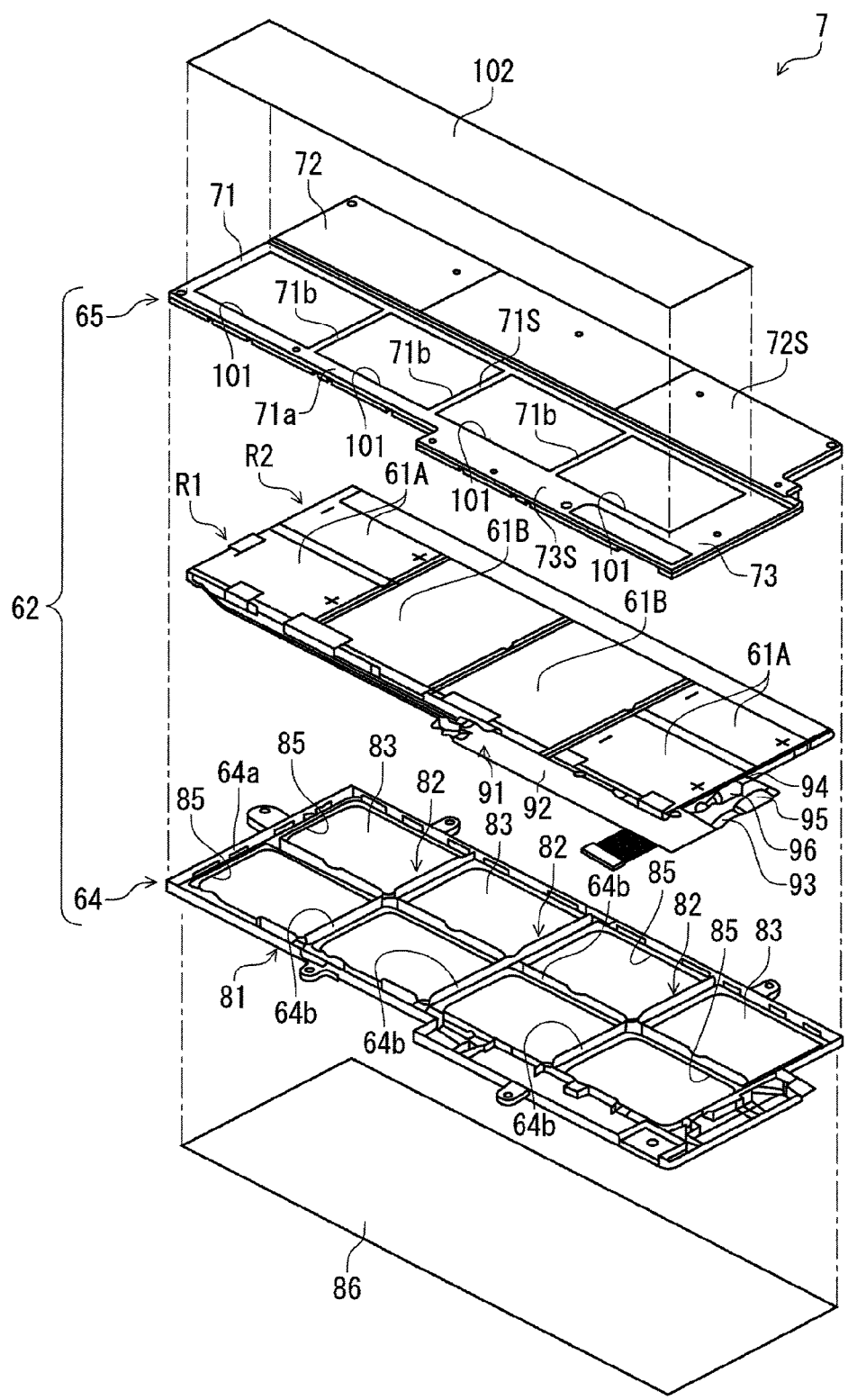
FIG. 12 is an exploded perspective view of a battery unit shown in FIG. 9.
Figure 13:
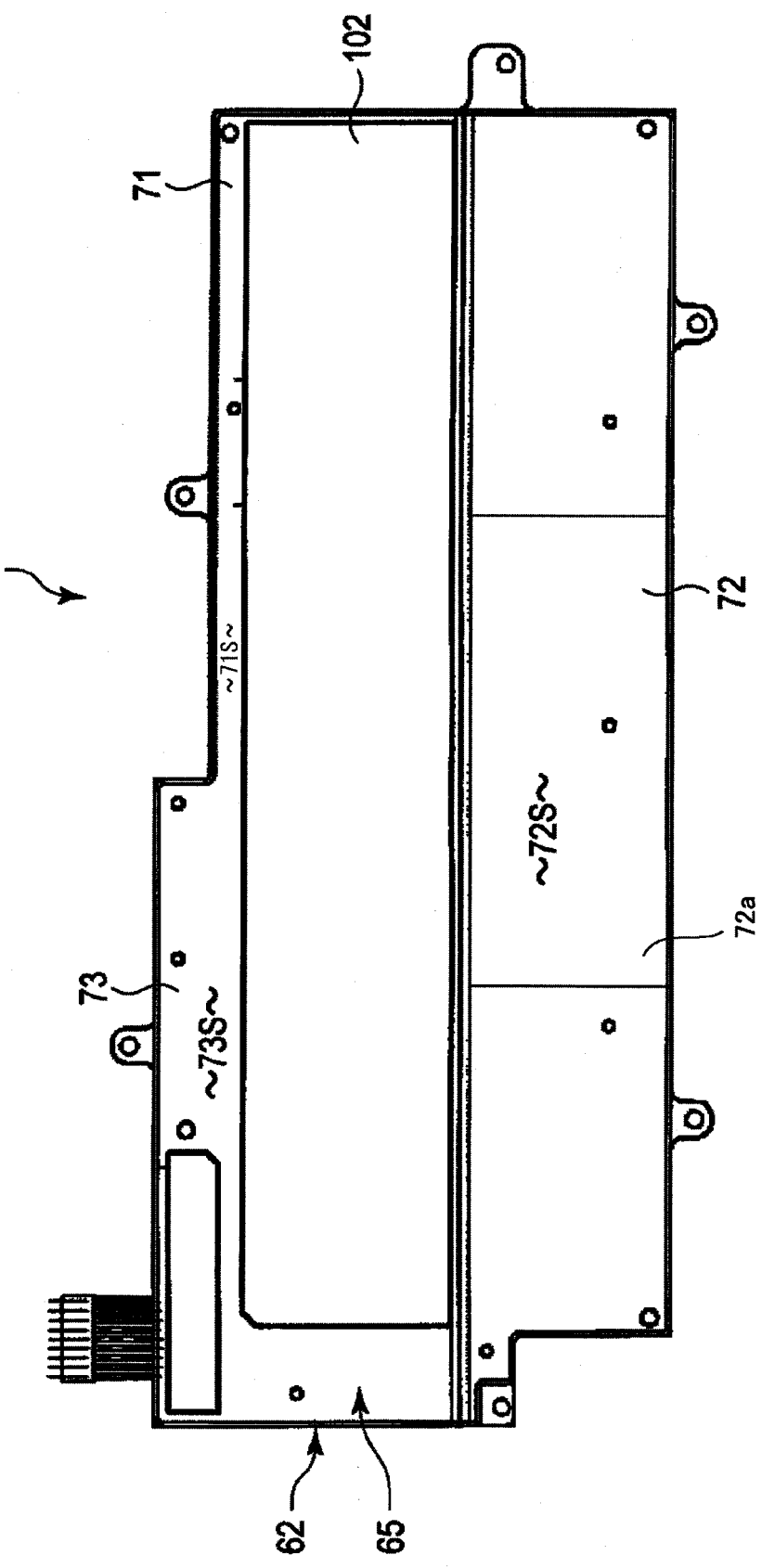
FIG. 13 is a plan view of the battery unit shown in FIG. 9.
Figure 14:
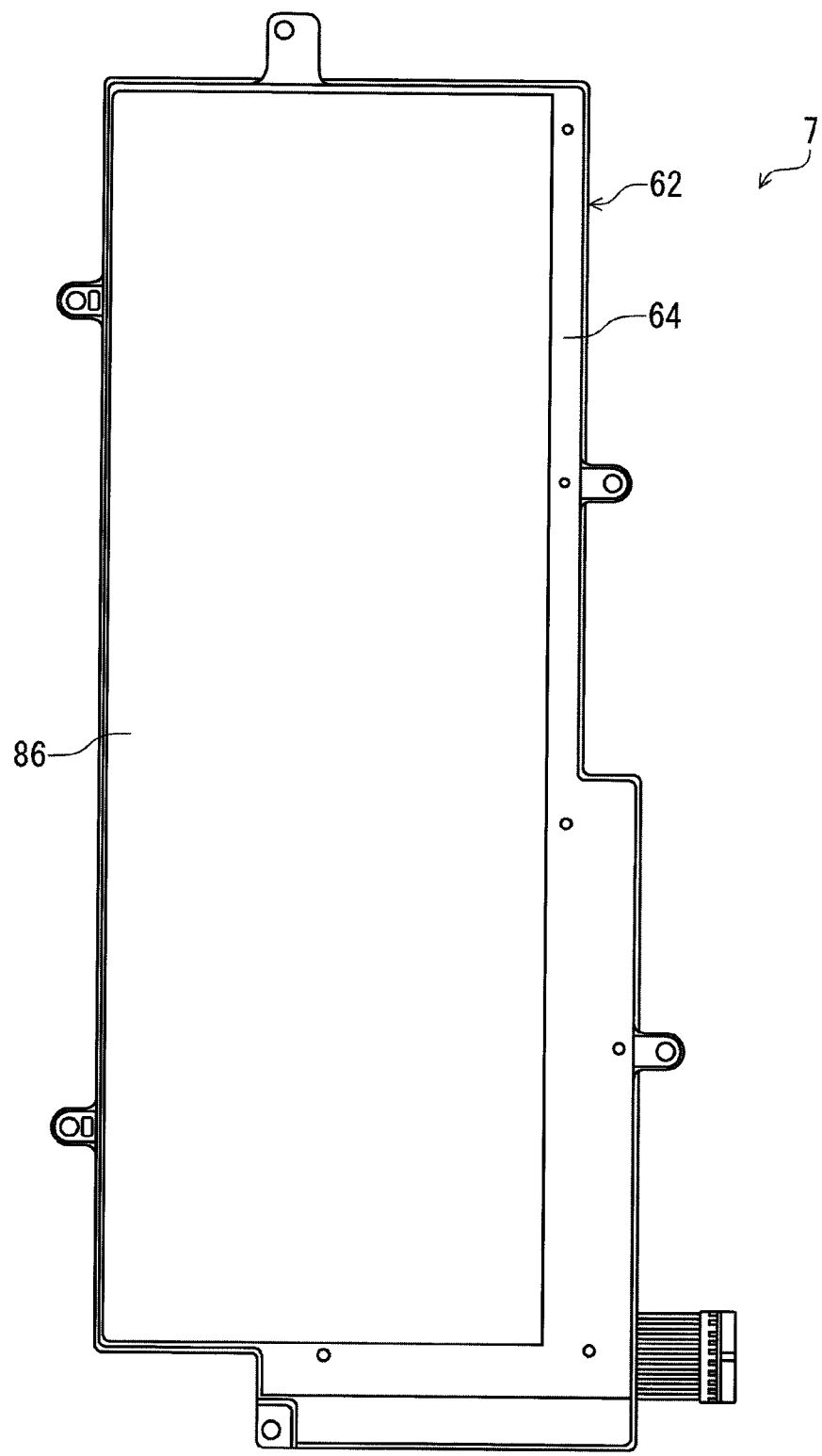
FIG. 14 is a bottom view of the battery unit shown in FIG. 9.
Figure 15:
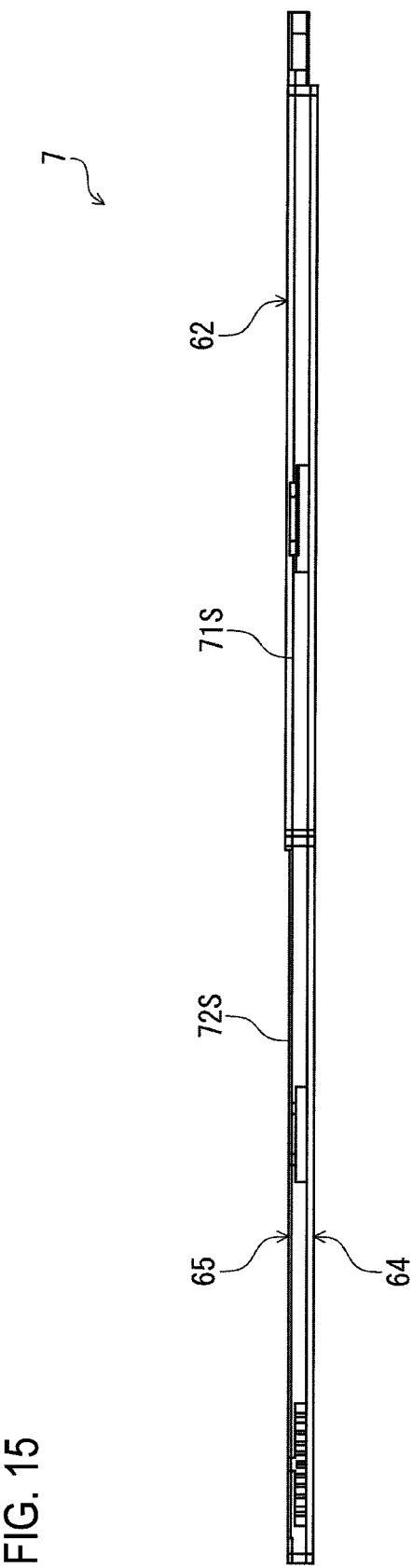
FIG. 15 is a side view of the battery unit shown in FIG. 9.
Figure 16:
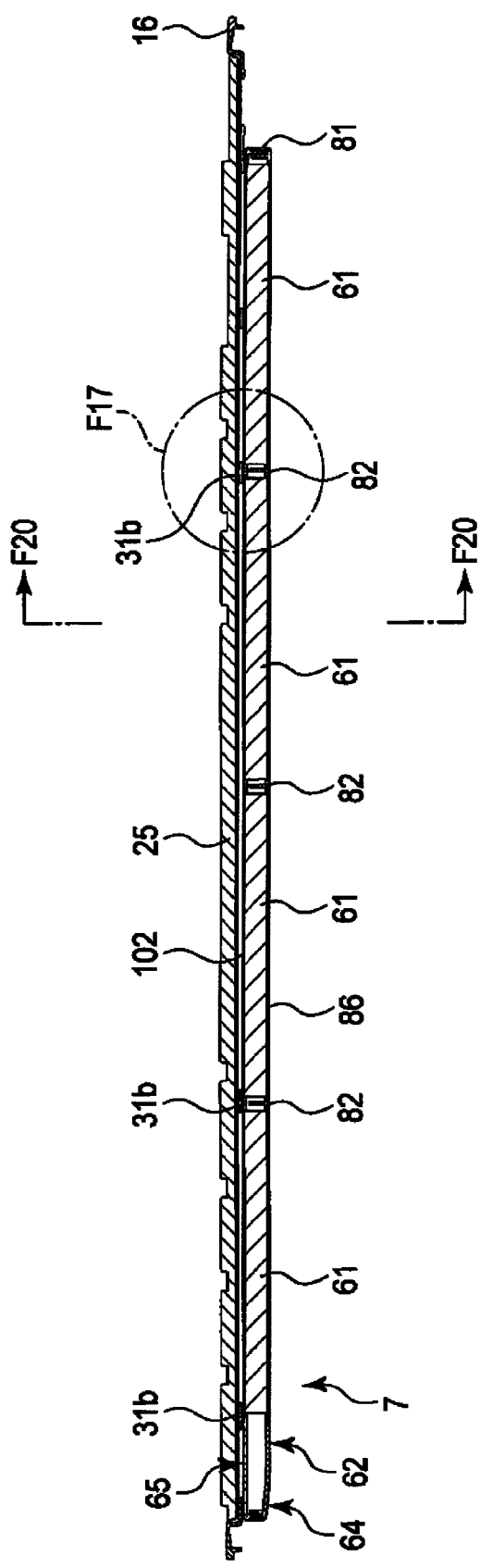
FIG. 16 is a cross-sectional view of a keyboard and the battery unit shown in FIG. 5 taken along the line F16-F16.

As shown in FIG. 12, the battery unit 7 includes a plurality of battery cells 61 and a case 62 (a battery case). For example, six battery cells 61 are provided. The battery cell 61 includes a rectangle plate type battery cell (a cell, a power supply, a battery, or a core) 61A and a substantially quadrate flat type battery cell (a cell, a power supply, a battery or a core) 61B that is thinner than the battery cell 61A (thinner in the thickness direction of the housing 4 and thinner in the thickness direction of the case 62). The longitudinal direction of the battery cell 61A is substantially matched with the longitudinal direction of the battery unit 7.

The battery cell 61A is spaced apart from the lower wall 17 of the housing 4 with the substantially same distance as the battery cell 61B. That is, as seen from the bottom surface of the housing 4, there is no step between the battery cell 61A and the battery cell 61B, which are disposed on the same plane.

Two battery cells 61A are arranged with the battery cell 61B therebetween and arranged in two rows. The battery cell 61B is located between the battery cells 61A in a direction where the two rows of battery cells 61A extend (in a longitudinal direction of the battery unit 7). The battery cell 61 includes two battery cells 61A located in a first row R1 and two battery cells 61A located in a second row R2, and two battery cells 61B located therebetween. The battery cells 61A are parallel to each other in the longitudinal direction in each of the rows.

The battery cells 61A and 61B of the present exemplary embodiment are plate types and relatively thin. The battery cells 61A and 61B include a first surface 61a, a second surface 61b, and third surfaces 61c, 61c (see FIG. 17). The first surface 61a is, for example, a top surface. The second surface 61b is opposite to the first surface 61a, for example, a bottom surface. The third surface 61c extends between the first surface 61a and the second surface 61b and extends in a direction intersecting the first surface 61a and the second surface 61b (for example, substantially orthogonal direction). The third face 61c is, for example, a side surface. The third surface 61c is smaller than the first surface 61a and the second surface 61b. A corner C1 of the third surface 61c and the first surface 61a and a corner C2 of the third surface 61c and the second surface 61b have an arc shape round.

As shown in FIG. 12, the plurality of battery cells 61A and 61B are arranged to be parallel to each other in a direction intersecting a plate thickness direction (thickness direction) of the battery cell 61 (for example, substantially an orthogonal direction). That is, the battery cells 61A and 61B are arranged so as to be parallel to each other while facing the third surface 61c.

As shown in FIG. 12, the case 62 includes a base 64 (main body) and a cover 65 that is attached (combined) to the base 64. The battery cells 61A and 61B are located between the base 64 and the cover 65.

The base 64 is formed with a framed structure which is formed of a frame and a joist, and is open upwardly and downwardly. Specifically, the base 64 includes a frame 64a and a joist 64b. The frame 64a encloses the plurality of battery cells 61 so as to be integrated therewith. The frame 64a is located outside the plurality of battery cells 61. The frame 64a configures the peripheral wall of the base 64. The frame 64a is a rib that erects in a thickness direction of the battery cell 61 and faces the third surface 61c of the battery cell 61.

The joist 64b is provided inside the frame 64a in a lattice pattern and located between the plurality of battery cells 61. The joist 64b is a rib that erects in the thickness direction of the battery cells 61A and 61B and extends between the third surfaces 61c of the plurality of battery cells 61.

Figure 17:
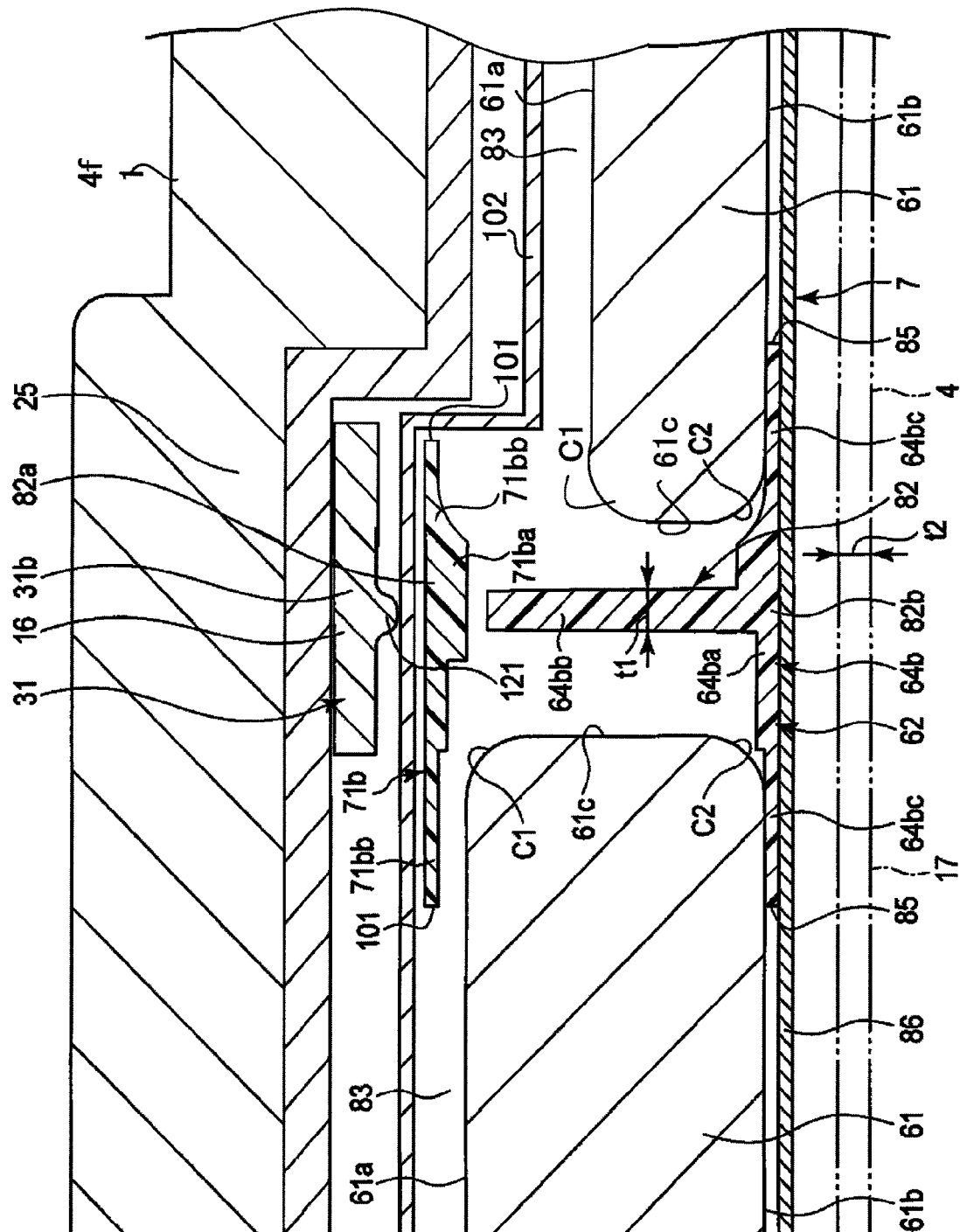
FIG. 17 is an enlarged cross-sectional view of a part of the battery unit shown in FIG. 16 enclosed by the line F17.

FIG. 17 shows the joist 64b in detail. As shown in FIG. 17, the joist 64b includes a first portion 64ba, a second portion 64bb, and a third portion 64bc. The first portion 64ba extends so as to be substantially parallel to the second surface 61b of the battery cell 61 and also inserted between the plurality of battery cells 61. A part of the first portion 64ba faces the third surface 61c of the battery cell 61. A part of the first portion 64ba faces the corner C2 of the battery cells 61A and 61B in a direction substantially parallel to the second surface 61b of the battery cell 61.

The second portion 64bb is a rib that erects in a thickness direction of the battery cell 61 and extends along the third surface 61c of the battery cell 61. The second portion 64bb faces the third surface 61c of the battery cell 61, and is provided over almost the entire length of the joist 64b reinforcing the joist 64b.

The third portion 64bc extends from the edge of the first portion 64ba and faces the second surface 61b of the battery cell 61. The third portion 64bc is thinner and weaker than the first portion 64ba. The third portion 64bc restricts the upper and lower position of the battery cell 61, but it does not need to have substantial strength. The frame 64a has almost the same configuration as the joist 64b.

As shown in FIG. 12, the cover 65 includes a first portion 71 having a framed structure and second and third portions 72 and 73 serving as a lid. The first portion 71 will be described here, and the second and third portions 72 and 73 will be described below. The first portion 71 includes a frame 71a and a joist 71b. The frame 71a is located so as to correspond to a part of the frame 64a of the base 64 and face the frame 64a of the base 64. The frame 71a extends toward the base 64 and is connected with the frame 64a of the base 64.

The joist 71b is located so as to correspond to the joist 64b of the base 64 and faces the joist 64b of the base 64. As shown in FIG. 17, the joist 71b includes a first portion 71ba and a second portion 71bb. The first portion 71ba extends so as to be substantially parallel to the first surface 61a of the battery cell 61 and is inserted between the plurality of battery cells 61. The first portion 71ba faces the second portion 64bb of the joist 64b of the base 64 in a thickness direction of the battery cell 61. A part of the first portion 71ba faces the third surface 61c of the battery cell 61. A part of the first portion 71ba faces the corner C1 of the battery cell 61 in a direction substantially parallel to the first surface 61a of the battery cell 61.

The second portion 71bb extends at the edge of the first portion 71ba and faces the first surface 61a of the battery cell 61. The second portion 71bb is thinner and weaker than the first portion 71ba. The second portion 71bb does not need to have substantial strength. A space is formed between the second portion 71bb and the battery cell 61.

Figure 18:
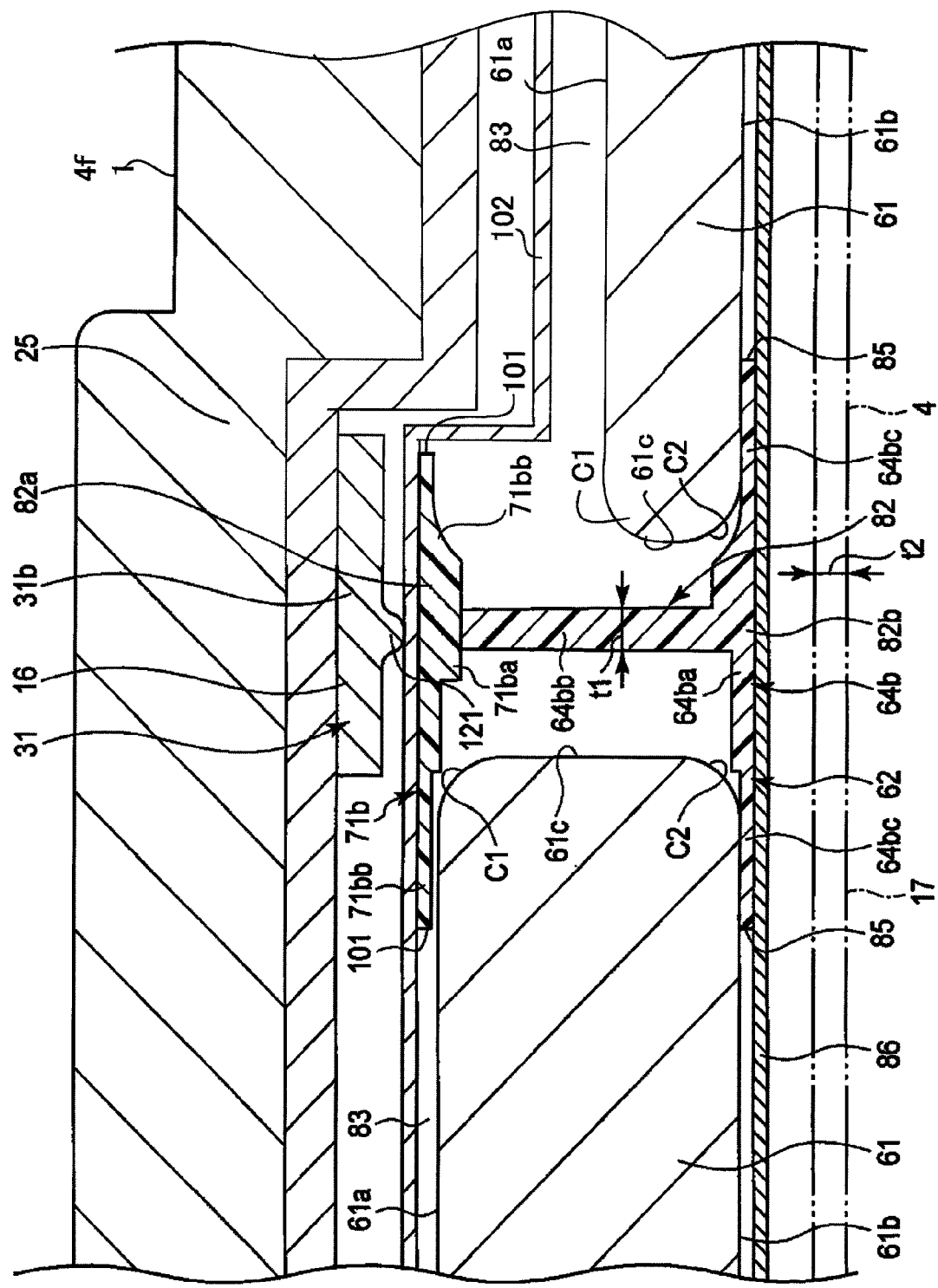
FIG. 18 is an enlarged cross-sectional view of a part of the battery unit shown in FIG. 16 enclosed by the line F17.

FIG. 18 illustrates a status when an external pressure is applied to the case 62. When the external pressure is applied, the joist 71b of the cover 65 is bent toward the joist 64b of the base 64 in some cases. In this case, the joist 71b of the cover 65 abuts onto the joist 64b of the base 64 and is supported by the joist 64b of the base 64. Even though the joist 71b of the cover 65 abuts on the joist 64b of the base 64, a space may be maintained between the second portion 71bb of the joist 71b of the cover 65 and the battery cell 61. The second portion 71bb of the joist 71b of the cover 65 may slightly contact the battery cell 61.

The case 62 includes a frame 81 and a plurality of joists 82 by coupling the base 64 and the cover 65. The frame 81 is configured by a frame 64a of the base 64 and a frame 71a of the cover 65. The joist 82 is configured by the joist 64b of the base 64 and the joist 71b of the cover 65. The joist 82 is an example of "a supporting portion". The case 62 is formed of, for example, plastic. The frame 81 and the plurality of joists 82 are integrally molded by plastic.

The frame 81 (first frame) configures a peripheral surface (peripheral wall) of the case 62 and encloses the plurality of battery cells 61. The plurality of joists 82 are provided inside the frame 81 in a lattice pattern. The plurality of joists 82 includes two joists 82 that extend in the longitudinal direction of the battery unit 7 and three joists 82 that extend in a cross (width) direction of the battery unit 7.

Each of the joists 82 is located between the battery cells 61 and faces the third surface 61c of the battery cell 61. With this configuration, six receiving modules 83 (openings) divided by the joists 82 are provided inside the frame 81. In each of the receiving modules 83, a battery cell 61 is accommodated.

As shown in FIGS. 17 and 18, the joists 82 are formed to be thicker than the battery cells 61. That is, a part of the joists 82 is located closer to the inner surface of the housing 4 than the battery cell 61. Specifically, the joist 82 includes a first portion 82a and a second portion 82b. The first portion 82a is located closer to the upper wall 16 (the keyboard attaching module 31) than the first surface 61a of the battery cell 61. The second portion 82b is located closer to the lower wall 17 than the second surface 61b of the battery cell 61. The frame 81 is also formed to be thicker than the battery cell 61.

As shown in FIG. 12, a first opening 85, formed in the base 64, is provided between the frame 81 and the joist 82. That is the first opening 85 is provided between the frame 64a and the joist 64b of the base 64. The first opening 85 provided in each of the receiving modules 83 faces the second surface 61b of the battery cell 61 which is exposed to the outside through the first opening 85.

As shown in FIG. 12, a first sheet 86 (a first label or a first insulator) is attached onto the lower surface of the case 62. The first sheet 86 is, for example, a paper, very thin, and is a non rigid sheet that does not have a substantial strength (rigidity).

The thickness of the first sheet 86 is thinner than that of the joist 82 t1, and thinner than that of the housing 4 t2. The first sheet 86 covering the plurality of battery cells 61 has a size enough to cover almost the entire case 62 and integrally covers the plurality of receiving modules 83 (first openings 85).

As shown in FIG. 12, the battery unit 7 includes a protection circuit 91 (a circuit block) which in turn includes a protection circuit board 92, a lead plate 93, an insulating plate 94, a poly switch 95, and a temperature fuse 96. The protection circuit 91 does not overlap with the battery cell 61. The protection circuit 91 is provided outside the frame 81 and is electrically connected to the battery cell 61. By adapting the configuration according to the present exemplary embodiment, a mounting degree of freedom for the components that are electrically connected to the protection circuit 91 may be enhanced.

The protection circuit 91 is disposed to be adjacent to the battery cell 61A which is thicker than the battery cell 61B, so that the protection circuit 91 is disposed in an L shape along the outer circumference of the frame 81. The case 62 includes a second frame 81 to which the protection circuit 91 is attached. The second frame 81 is connected to the frame 81 to reinforce the frame 81.

As shown in FIG. 12, the cover 65 is attached to the base 64 at the opposite side of the first sheet 86 and, as described above, includes the first portion 71, the second portion 72, and the third portion 73.

The first portion 71 corresponds to the battery cell 61 that is located in a first row R1. A second opening 101 is provided in the first portion 71. The second opening 101 is provided between the frame 81 and the joist 82. In other words, the second opening 101 is provided between the frame 71a and the joist 71b of the cover 65. At least one of the plurality of battery cells 61 is exposed through the second opening 101. The second opening 101 faces the first surface 61a of the battery cell 61. The first surface 61a of the battery cell 61 is exposed to the outside through the second opening 101.

As shown in FIG. 12, a second sheet 102 (a second label or a second insulator) is attached to the first portion 71 of the cover 65. The second sheet 102 is, for example, a paper, very thin and a non rigid sheet that does not have a substantial strength (rigidity).

The thickness of the second sheet 102 is thinner than that of the joist 82 t1, and thinner than that of the housing 4 t2. The second sheet 102 integrally covering the plurality of battery cells 61 has a size enough to cover almost the entire case 62 and integrally covers the plurality of receiving modules 83 (second openings 101).

As shown in FIG. 12, the second portion 72 faces at least separate one of the plurality of battery cells 61 and corresponds to a portion of the battery cells 61 that are located in a second row R2. The second portion 72 is formed to be a plate shape (a lid or a planar shape) and integrally covers the portion of the battery cells 61 that extends to the second row R2. The second portion 72 is formed to be thicker than the first portion 71.

In the second portion 72, an opening 72a which is recessed toward the inside the case 62 as compared to the surroundings (a concave portion, a dent, an overlapping portion, or a portion which overlaps the cell 61B) is formed in the position corresponding to the dent of the touch pad 26 (a position that overlaps the touch pad 26 in a thickness direction of the housing 4, a position inserted between the palm rests 36, or a region spaced apart from the keyboard 25), and the opening 72a has almost the same step as the step of battery cell 61A and the battery cell 61B.

The second portion 72 has a higher rigidity than the first portion 71 and reinforces the case 62. The second portion 72 extends in a longitudinal direction of the housing 4 (circuit board 6). The second portion 72 contributes to prevent the housing 4 (circuit board 6) from being bent in the longitudinal direction.

As shown in FIGS. 7, 12, and 20, the second portion 72 upwardly protrudes with respect to the first portion 71. That is, the surface 72s of the second portion 72 has a step with respect to the surface 71s of the first portion 71, and the surface 72s of the second portion 72 is located to be higher than the surface 71s of the first portion 71.

As shown in FIG. 12, the third portion 73 corresponds to the protection circuit 91 (the second frame 81). The third portion 73 attached to the second frame 81 is formed to be a plate shape (a lid or a planar shape) and covers at least a part of the protection circuit 91. The third portion 73 is formed to be thicker than the first portion 71.

The third portion 73 has a higher rigidity than the first portion 71 and reinforces the case 62. The third portion 73 extends in a longitudinal direction of the housing 4 (circuit board 6). The third portion 73 contributes to prevent the housing 4 (circuit board 6) from being bent in the longitudinal direction. The second portion 72 and the third portion 73 are located to be separated at both sides of the first portion 71. Therefore, the first portion 71 is reinforced by the second portion 72 and the third portion 73.

As shown in FIGS. 7, 12, and 20, the third portion 73 is provided in a position that is apart from the joist 82. A part of the third portion 73 overlaps (faces) the joist 82 in a direction intersecting the thickness direction of the battery unit 7 (for example, substantially orthogonal direction). The third portion 73 does not protrude upwardly with respect to the first portion 71. The surface 73s of the third portion 73 is located on almost the same plane as the surface 71s of the first portion 71.

Figure 19:
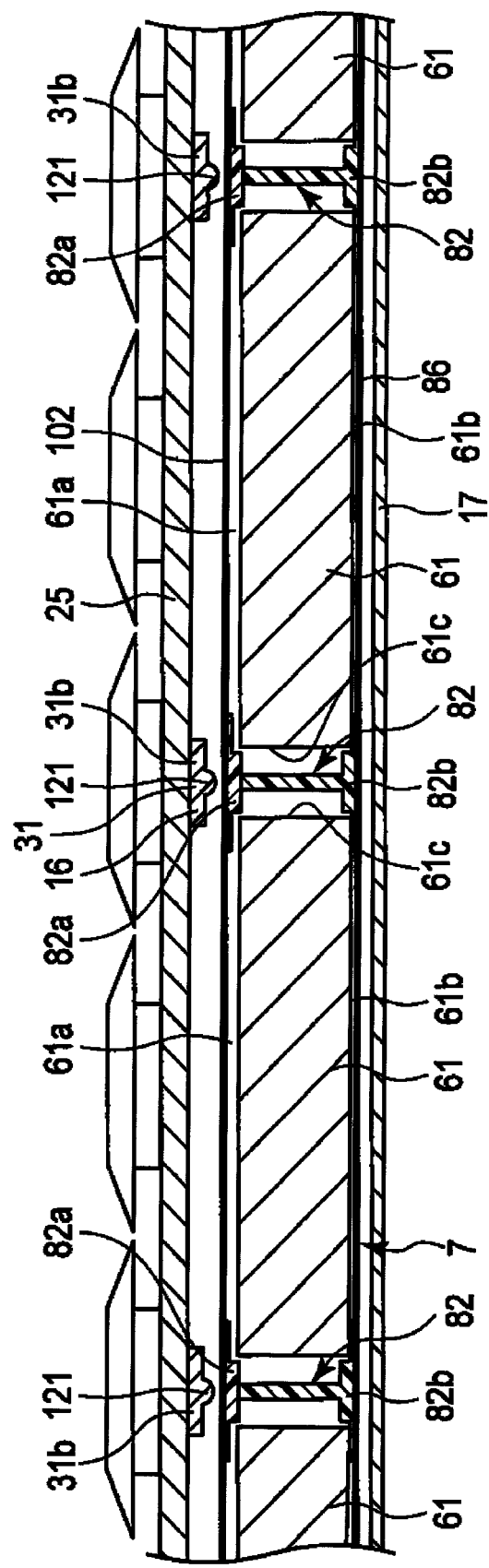
FIG. 19 is a cross-sectional view schematically illustrating the structure of a battery unit according to the second exemplary embodiment.
Figure 21:
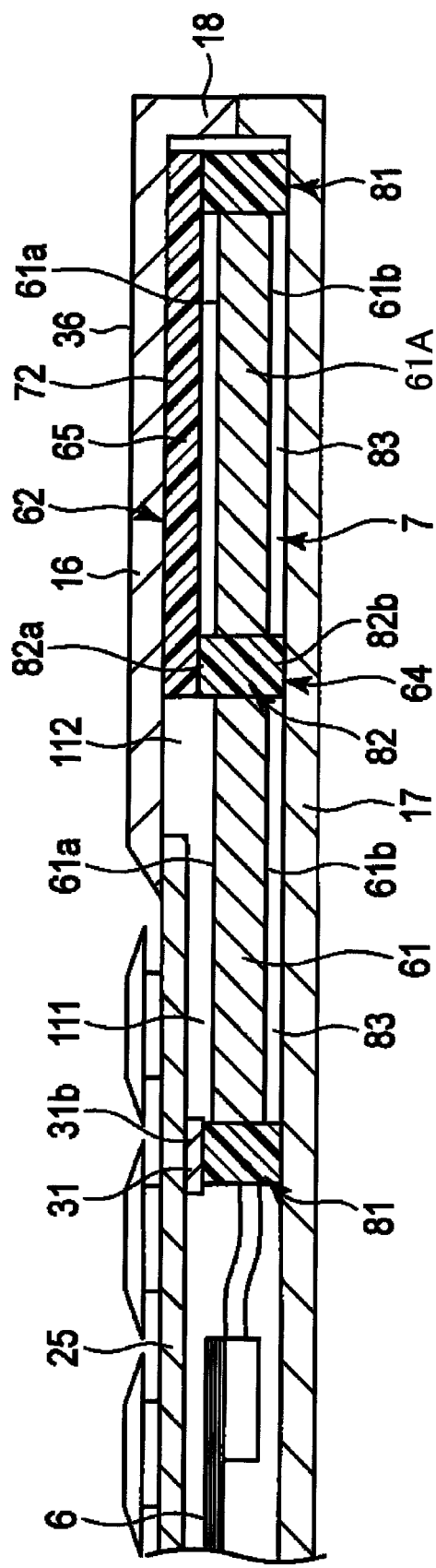
FIG. 21 is a cross-sectional view schematically illustrating the structure of the battery unit according to the second exemplary embodiment.
Figure 22:
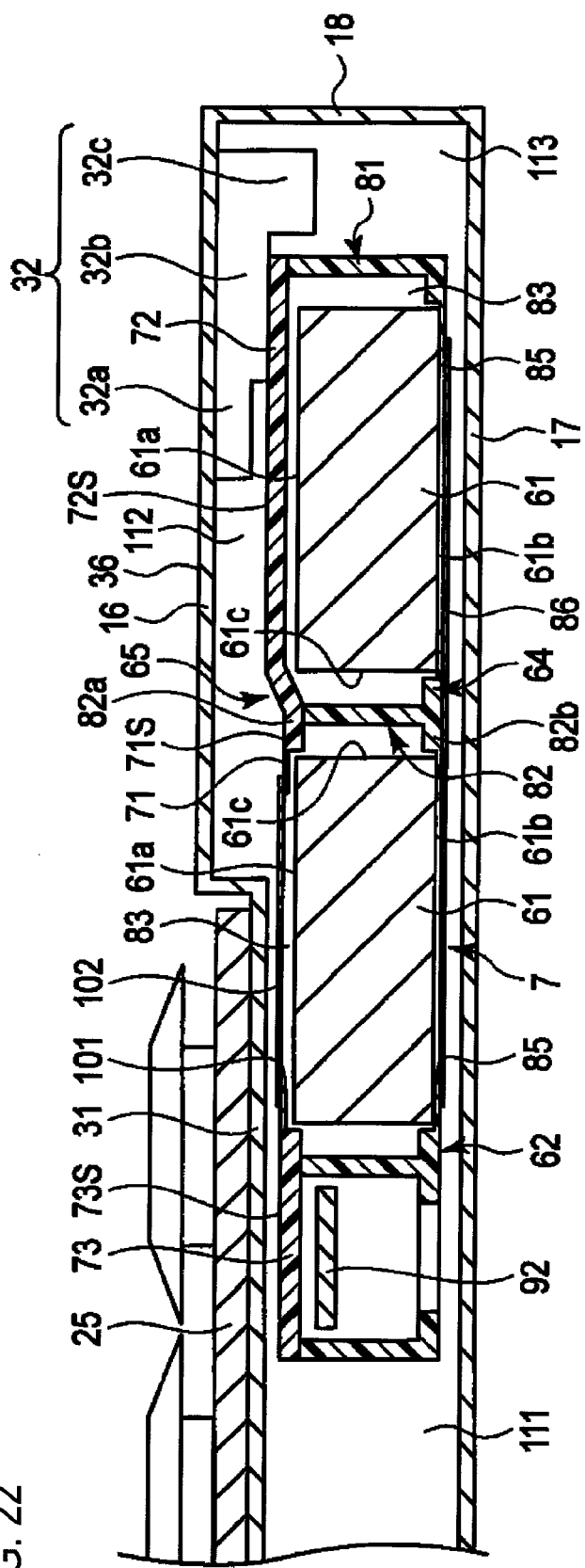
FIG. 22 is a cross-sectional view schematically illustrating the structure of the battery unit according to the second exemplary embodiment.

Next, the relationship of the structure of the housing 4 and the battery unit 7 will be described. FIGS. 19, 21, and 22 schematically illustrate the structure for the convenience of the description.

As shown in FIGS. 20 and 22, the housing 4 includes a first region 111, a second region 112, and a third region 113. The first region 111 (a first portion) is a region in which the keyboard attaching module 31 is provided. In the first region 111, the keyboard attaching module 31 is recessed inside the housing and the thickness thereof is limited in the housing 4.

In the second region 112 (a second portion), the palm rests 36 and first and second portions 32a and 32b of the touch pad attaching module 32 are provided. The thickness of the second region 112 in the housing 4 is thinner than the first region 111. In the third region 113 (a third portion), a third portion 32c of the touch pad attaching module 32 is provided. The thickness of the third region 113 in the housing 4 is thinner than the first region 111.

As shown in FIGS. 20 and 22, the battery cell 61 located in the first row R1 is located in the first region 111. In other words, the first portion 71 of the cover 65 is located in the first region 111 which is below the keyboard attaching module 31.

Parts of the battery cell 61A and the battery cell 61B that are located in the second row R2 are located in the second region 112. That is, the second portion 72 of the cover 65 is located in the second region 112 that becomes spatially narrower and is located below the palm rests 36, the touch pad attaching module 32, and the first and second portions 32a and 32b of the touch pad attaching module 32.

As shown in FIGS. 6 and 17 to 19, the upper wall 16 of the housing 4 (keyboard attaching module 31) includes first and second protrusions 121, 122. The first and second protrusions 121, 122 are provided in inner surface of the housing 4 and protrude into the housing 4.

The first protrusion 121 protrudes toward the joist 82 of the battery unit 7. As shown in FIG. 6, the first protrusion 121 is a rib extending along the joist 82. When the upper wall 16 of the housing 4 is bent, the first protrusion 121 is supported by the joist 82. Therefore, as shown in FIG. 18, before the upper wall 16 (keyboard attaching module 31) contacts with the battery cell 61, the bending of the upper wall 16 is restricted.

As shown in FIG. 6, the second protrusion 122 extends in a direction intersecting the first protrusion 121 (for example, substantially orthogonal direction). The second protrusion 122 extends in a longitudinal direction of the housing 4. The second protrusion 122 protrudes toward the frame 81 of the battery unit 7. When the upper wall 16 of the housing 4 is bent, the second protrusion 122 is supported by the frame 81. Therefore, before the upper wall 16 (keyboard attaching module 31) is contact to the battery unit 7, the bending of the upper wall 16 is restricted.

Next, several mounting structures of the present exemplary embodiment will be described.

As shown in FIG. 10, the edge 131 (front edge) of the battery unit 7 extends in a longitudinal direction of the housing 4 and reaches almost over the entire housing 4. The edge 131 of the battery unit 7 extends along the sound emission direction of the second sound emission hole 42b of the first speaker 37. That is, the edge 131 of the battery unit 7 extends in a direction from the second sound emission hole 42b of the first speaker 37 to the second sound emission hole 42b of the second speaker 38.

The edge 131 of the battery unit 7 extends along the sound emission direction of the second sound emission hole 42b of the second speaker 38. That is, the edge 131 of the battery unit 7 extends in a direction from the second sound emission hole 42b of the second speaker 38 to the second sound emission hole 42b of the first speaker 37.

Therefore, the sound emitted from the second sound emission hole 42b of the first speaker 37 and the sound emitted from the second sound emission hole 42b of the second speaker 38 are guided along the edge 131 of the battery unit 7 to clash with each other in the housing 4 so as to be reinforced. That is, the battery unit 7 configures a part of the guide module that guides the sound from the first and second speakers 37 and 38 in the housing 4.

As shown in FIG. 11, the edge 132 (rear edge) of the battery unit 7 extends in a longitudinal direction of the housing 4 and reaches almost the entire housing 4. Accordingly, a wall that extends in the longitudinal direction of the housing 4 is configured within the housing 4 by the edge 132 of the battery unit 7. The air received from the second suction hole 54 is guided to the wall to be blown toward the fan 49. That is, the battery unit 7 configures a part of the rectifying module that guides the flow of the wind in the housing 4. In other words, a part of a duct that faces the fan 49 from the second suction hole 54 is configured by the edge 132 of the battery unit 7 and the rear wall 18b of the housing 4.

As shown in FIG. 11, the corner 19 provided on the lower wall 17 of the housing 4 is provided so as to be apart from the battery unit 7. Accordingly, a load is hardly applied to the battery unit 7.

With this configuration, the electronic equipment 11 may become thinner.

A general battery case is entirely configured by a hard plastic. When using this configuration, the lower and upper sides of the battery cell 61 are needed to be thick, so that the battery unit is formed to be thick.

In the present exemplary embodiment, the battery unit 7 includes the joist 82 (supporting module) which is located between the plurality of battery cells 61 and is thicker than the battery cell 61. According to this configuration, the stress from the outside of the battery unit 7 is supported by the joist 82 so that the stress is hardly applied directly to the battery cell 61.

Therefore, even though the entire battery case 62 is not formed of a hard plastic, the battery cell 61 may be protected. Therefore, while maintaining the mechanical strength, the battery unit 7 becomes thinner and lighter, which leads the electronic equipment 11 to be thinner and lighter.

In the present exemplary embodiment, the battery unit 7 includes the case 62 having the receiving modules 83, the battery cell 61 that is accommodated in the receiving module 83 and exposed through the opening 85, and the sheet 86 that is attached to the case 62 and covers the opening 85. With this configuration, a part of the case 62 may be configured by a thinner and lighter sheet 86, which leads the battery unit 7 to be thinner and lighter.

In the present exemplary embodiment, the battery unit 7 includes the frame 81 that encloses the plurality of battery cells 61 and the joists 82 that are provided inside the frame 81 in a lattice pattern and located between the plurality of battery cells 61. With this configuration, the relatively strong protection structure that protects the battery cell 61 is configured by the frame 81 and the joists 82 so that a part of the case 62 may be configured with a less strong, thinner, and lighter member. Therefore, it is possible to achieve a thinner and lighter battery unit 7.

In the present exemplary embodiment, the housing 4 includes the protrusion 121 that is provided on the inner surface of the housing 4 and protrudes toward the joist 82. With this configuration, when a force is applied to the housing 4 so that the housing 4 is bent, before the inner surface of the housing 4 contacts with the battery cell 61, the protrusion 121 is surely supported by the joist 82. That is, the impact or the load from the housing 4 is surely avoided by the joist 82 of the case 62 through the protrusion 121. Therefore, a part of the case 62 may be configured by a less strong, thinner, and lighter member, which makes it possible to achieve a thinner and lighter battery unit 7.

In the present exemplary embodiment, the protrusion 121 is a rib that extends along the joist 82. With this configuration, the protrusion 121 is more surely supported by the joist 82. Therefore, a part of the case 62 may be configured by a less strong, thinner, and lighter member, which makes it possible to achieve a thinner and lighter battery unit 7.

In the present exemplary embodiment, the cover 65 includes the first portion 71 and the second portion 72 that is thicker than the first portion 71 and reinforces the case 62. According to the present exemplary embodiment, the strength of the case 62 is surely ensured. Specifically, by providing the second portion 72, the strength of the case 62 against the bending and torsion is improved.

The second portion 72 is provided below the palm rest 36. With this configuration, the palm rest 36 is reinforced by the second portion 72. Therefore, the palm rest 36 is hardly bent.

In the present exemplary embodiment, the cover 65 includes the third portion 73 that covers at least a part of the protection circuit 91, is formed to be thicker than the first portion 71, and reinforces the case 62. According to the present exemplary embodiment, the strength of the case 62 against the bending and torsion is further improved.

In the present exemplary embodiment, the second and third portions 72 and 73 of the cover 65 are located to be separated at both sides of the first portion 71 of the cover 65. With this configuration, the case 62 is more efficiently reinforced by the second and third portions 72 and 73.

In the present exemplary embodiment, the frame 81 and the joist 82 are integrally molded of a plastic material. With this configuration, improvement in the manufacturability, easy handling, or manufacturing cost of the case 62 may be achieved.

In the present exemplary embodiment, the plurality of battery cells 61 and the circuit board 6 partially overlap in a direction intersecting the thickness direction of the housing 4. With this configuration, the housing 4 may be formed to be thinner. In the present exemplary embodiment, the second portion 72 of the cover 65 extends in the longitudinal direction of the circuit board 6. With this configuration, the longitudinal direction of the circuit board 6 may be reinforced.

In the present exemplary embodiment, the region where the touch pad 26 is provided is lower than the key top of the keyboard 25 or the surrounding surface (a frame type member to which tile type keyboards are inserted) (the region is recessed toward the inside of the housing 4). With this configuration, it is possible to improve the operability of the touch pad 26. Specifically, if the position of a target that is manipulated by the thumb finger which is considered to mainly manipulate the touch pad 26 is lower than the position that is touched by the index finger, the middle finger, the ring finger, and the little finger that mainly manipulate the keyboard 25, it is easy to manipulate the touch pad. That is, if the touch pad 26 is lower than the keyboard 25, the position of the thumb finger is led to a position that is manipulated in the situation corresponding to the joint of a human, which prevents tenosynovitis caused by long hours of work.

The opening 4f configured by the concave portion that encloses the touch pad 26 is open to the side of the housing 4. With this configuration, the open/close operation of the display unit is efficiently performed. Specifically, in the notebook PC that aims to be thinner as shown in the drawings of the present exemplary embodiment, in order to make the user consider to be thinner, a shape that the leading edge becomes thinner (the cross-section of the housing when the display unit is closed is a streamlined shape) is adapted in many cases. In this case, when the upper and lower units are open from the closed state, it is hard to support the border of both units. However, with this configuration of the present exemplary embodiment, the region of the touch pad 26 is more recessed as compared to the surrounding side wall, which makes it possible to press the display unit near the corresponding portion.

In the present exemplary embodiment, a part of the battery unit 7 is located below the touch pad 26 and the palm rest 36. The battery unit 7 has a concaved surface corresponding to the concaved portion of the touch pad 26. This configuration contributes to high density mounting in the housing.

The opening 72a of the battery unit 7 is realized by adopting two different cells, for example, the battery cell 61A and the battery cell 61B that is thinner than the battery cell 61A. However, the opening 72a is not limited thereto, but may be realized by providing battery cells having steps and disposing the step so as to correspond to the step of the touch pad 26.

In the exemplary embodiment of the notebook type personal computer, the electronic component corresponding to the opening 72a of the battery unit 7 is a touch pad device, but is not limited thereto, and may be other electronic components in the housing 4. For example, in the housing 4, even though a step is formed by the difference in the size of the components or the dimension in the thickness direction of the housing between the circuit board, the storage device such as a hard disk, or a cooling device, which are not shown, when the step is disposed so as to correspond to the opening 72a of the battery unit 7, the high density mounting may be achieved. For example, in the exemplary embodiment of the television receiver described as the first exemplary embodiment, an electronic component 61C such as a small substrate (sub board) or a wiring route which is not shown is disposed in the opening 72a of the battery unit 7.

The present invention is not limited to the above-described exemplary embodiments, but the components thereof may be modified without departing from the gist of the invention. Various inventions may be formed by appropriately combining a plurality of components disclosed in the exemplary embodiments. For example, some components may be removed from the entire components described in the exemplary embodiment. Further, components in different exemplary embodiments may be appropriately combined.

For example, the joist 82 may be provided in any one of the base 64 and the cover 65. The joist 82 (supporting module) does not need to be formed in a lattice pattern. The frame 81 may be appropriately omitted. The second and third portions 72 and 73 of the case 62 are not essential components.

What is claimed is:

1. A battery structure comprising:
   an input device comprising a flat input surface;
   a housing configured to support the input device and to accommodate components therein;
   an electronic component in the housing;
   a first battery cell in the housing;
   a second battery cell in the housing, the second battery cell overlapping at least partially with the electronic component in a thickness direction of the housing, and being thinner than the first battery cell;
   a case comprising a frame configured to enclose the first and second battery cells and a joist inside the frame in a lattice pattern between the first and second battery cells; and
   a protection circuit configured to be electrically connected to the first and second battery cells at a position apart from the second battery cell.

2. The structure of claim 1, further comprising:
   a rib extending along the joist.

3. An electronic equipment comprising:
   a housing comprising a side surface, an input surface extending in a direction intersecting the side surface, a first concave portion located at the side surface, and a second concave portion that continues with the first concave portion and is opened at the input surface side;
   an electronic component in the housing and in a position overlapping the second concave portion in a thickness direction of the housing;
   a first battery cell in the housing and along an area at the side surface near the first concave portion;
   a second battery cell in the housing, along the first concave portion, at least partially overlaps the second concave portion in the thickness direction of the housing, and is thinner than the first battery cell;
   a case having a frame that encloses the first and second battery cells and a joist inside the frame in a lattice pattern and between the first and second battery cells; and
   a protection circuit configured to be electrically connected to the first and second battery cells at a position apart from the second battery cell.

4. The electronic equipment of claim 3, further comprising:
   a second sheet attached to the case,
   wherein the case comprises a base comprising a first opening and a first sheet attached to the base, and a cover attached to the base and opposite to the first sheet, and
   the cover comprises a first portion comprising a second opening through which at least one of the first and second battery cells is exposed and the second opening is covered by the second sheet in the first portion, and a second portion that faces another one of the first and second battery cells and formed to be thicker than the first portion to reinforce the case.

5. The electronic equipment of claim 4, wherein the protection circuit is along the outer circumference of the frame, and
   the cover comprises a third portion that covers at least a part of the protection circuit and is formed to be thicker than the first portion to reinforce the case.

6. The electronic equipment of claim 5, wherein the second and third portions of the cover are separated at both sides of the first portion of the cover.

7. An electronic equipment comprising:
   a housing comprising a first concave portion at a side surface;
   an electronic component in the housing and in a position overlapping the concave portion in a direction intersecting a thickness direction of the housing;
   a first battery cell in the housing and along an area at the side surface near the first concave portion; and
   a second battery cell in the housing, along the first concave portion, at least partially overlaps a second concave portion in the thickness direction of the housing, and is thinner than the first battery cell.

8. The electronic equipment of claim 7, wherein the electronic component is a touch pad device, and
   the touch pad device is attached in a position that is more recessed into the housing than another input device in a surrounding area.

9. The electronic equipment of claim 7, further comprising:
   a case that accommodates the first battery cell and the second battery cell,
   wherein the case comprises an opening formed by a step of the first battery cell and the second battery cell.

10. The electronic equipment of claim 7, further comprising:
    a case that accommodates the first battery cell and the second battery cell,
    wherein the case comprises a first surface overlapping the electronic component and a second surface that is opposite to the first surface, and
    the second surface is a flat surface that covers the first battery cell and the second battery cell and does not comprise a step.

* * * * *